United States Patent [19]

Van Cleave

[11] 4,038,539

[45] July 26, 1977

[54] ADAPTIVE PULSE PROCESSING MEANS AND METHOD

[75] Inventor: James R. Van Cleave, Furlong, Pa.

[73] Assignee: American Electronic Laboratories, Inc., Colmar, Pa.

[21] Appl. No.: 660,230

[22] Filed: Feb. 23, 1976

[51] Int. Cl.² .......................... G06F 15/34; H04B 3/04
[52] U.S. Cl. ..................................... 235/156; 328/165; 328/167; 333/18; 333/28 R; 333/70 T
[58] Field of Search ............................. 235/152, 156; 328/164–165, 167; 333/17, 18, 28 R, 70 T

[56] References Cited

U.S. PATENT DOCUMENTS

| 3,493,874 | 2/1970  | Finkel et al. ............... 328/165 X |
| 3,541,458 | 11/1970 | Klund ........................ 328/165   |
| 3,614,673 | 10/1971 | Kang et al. ................. 333/18    |
| 3,633,105 | 4/1972  | Lender et al. ............... 333/18 X  |
| 3,657,669 | 4/1972  | Proakis ...................... 333/70 T X |
| 3,723,911 | 3/1973  | Forney, Jr. .................. 333/18   |
| 3,732,410 | 5/1973  | Mackeghnie ................ 333/18 X    |
| 3,889,108 | 6/1975  | Cantrell ..................... 235/152  |

*Primary Examiner*—Jerry Smith
*Attorney, Agent, or Firm*—Jacob Trachtman

[57] ABSTRACT

A signal processing means and method of adaptively filtering input signals received at a terminal means in which the input signals include pulse signals and noise, with the pulse signals occurring at unknown times and having unknown durations, which includes signal filtering means having a first input for receiving signals derived from the terminal means, a second input and an output, the signal filtering means having a controllable filter characteristic for passing signals from its first input to its output responsive to signals received at its second input, and a signal analyzing means having an input receiving signals derived from said terminal means and an output delivering signals which are responsive to signals received at its input, to the second input of said signal filtering means for controlling its filter characteristic, whereby the output of the signal filtering means delivers signals corresponding to the pulse signals of the input signals to said terminal means while minimizing delivery of noise signals received at said terminal means. The means and method utilizes orthogonal transformations of the input signals for processing the input signals and adaptively filtering the orthogonal signal components for providing at the output, pulse signals present in the input signal with reduction in the noise level.

Walsh functions are utilized for filtering rectangular pulse signals while other orthogonal functions, including Fourier functions, are utilized for filtering non-rectangular pulse signals. The incoming signals are preferably converted to digital form and transformed by the orthogonal functions for adaptive filtering, after which the signals may be reconverted by an inverse transformation and delivered in digital or analog form. Rectangular pulse signals after being transformed back into the time domain, are further reconstructed by a thresholding operation providing the original DC level for the signal, together with the rectangular signals determined by the means and method of the invention to be present in the input signal.

106 Claims, 20 Drawing Figures

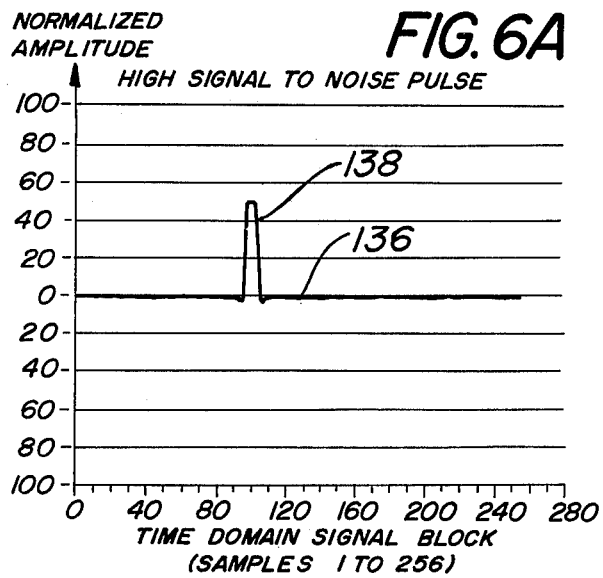
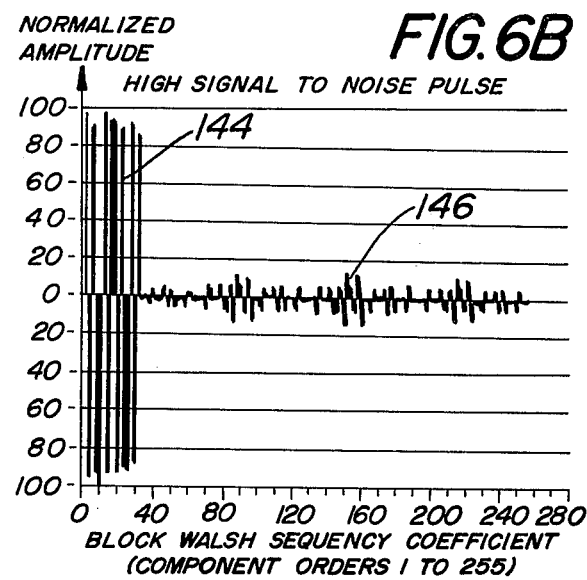
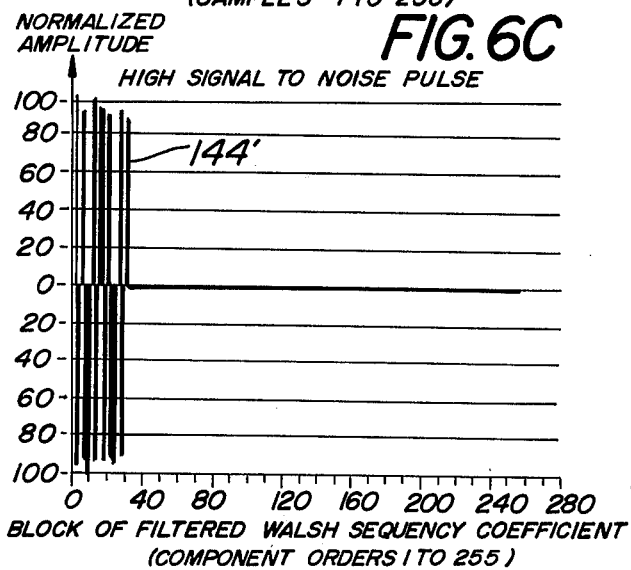
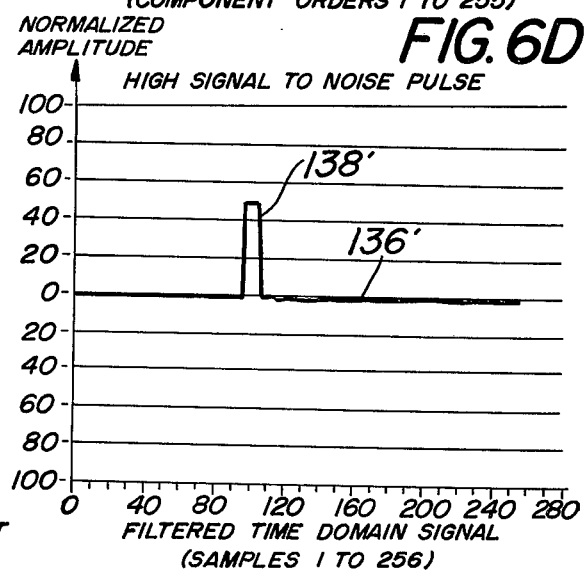
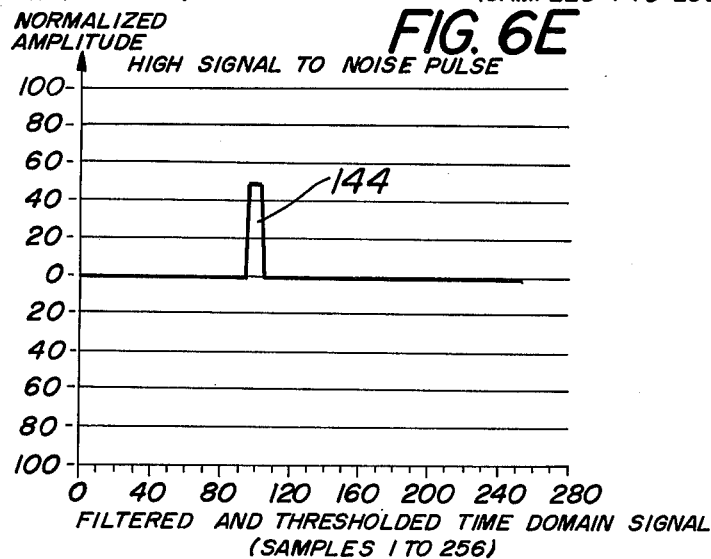

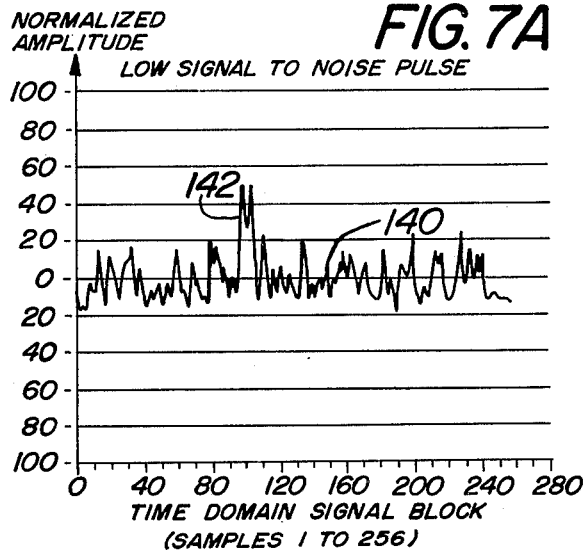
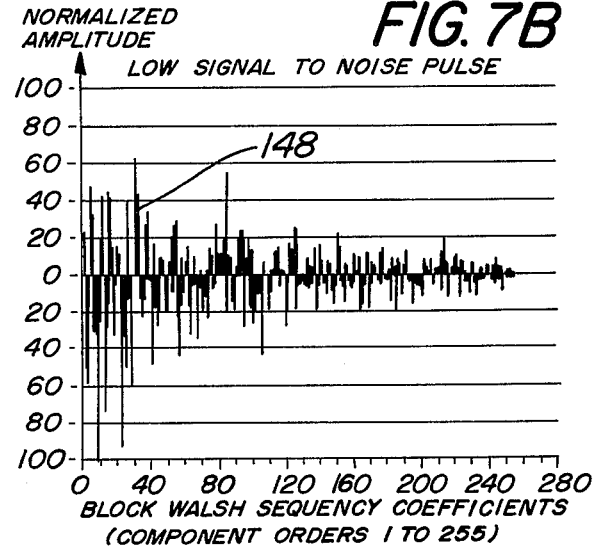
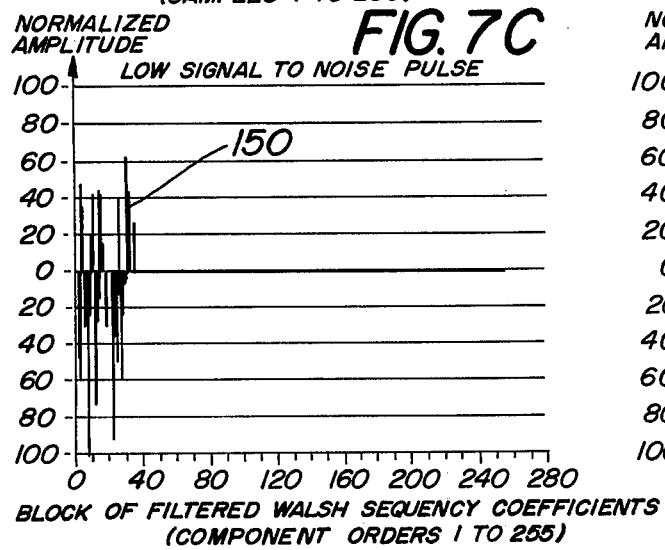
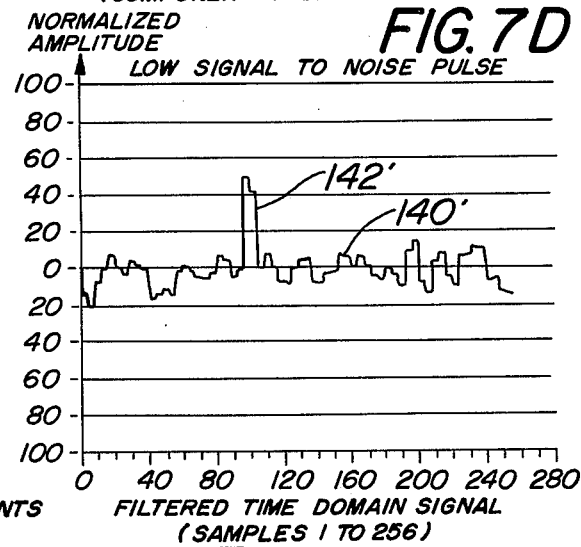
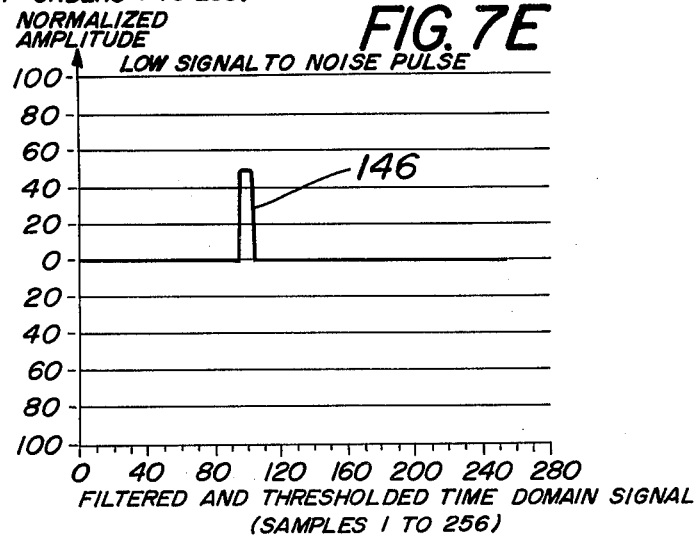

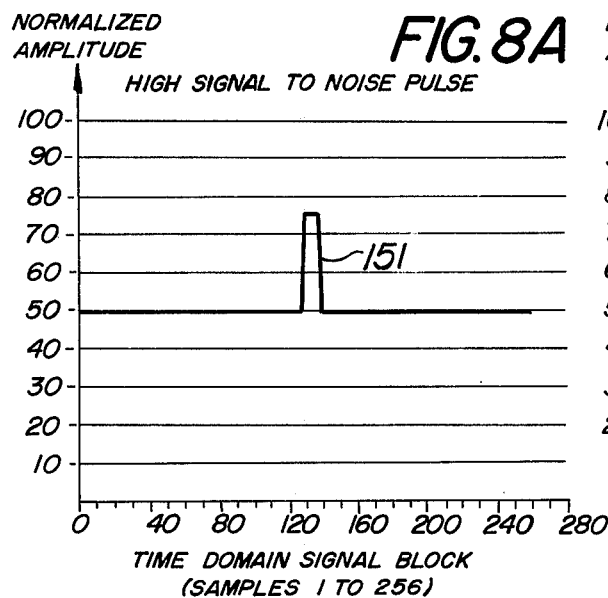
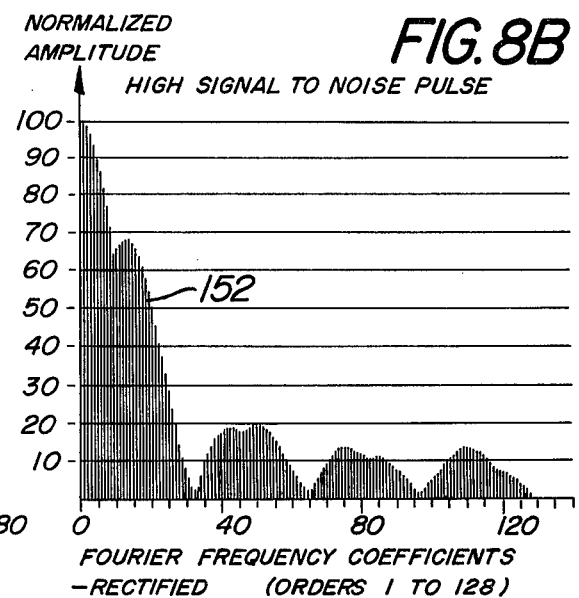
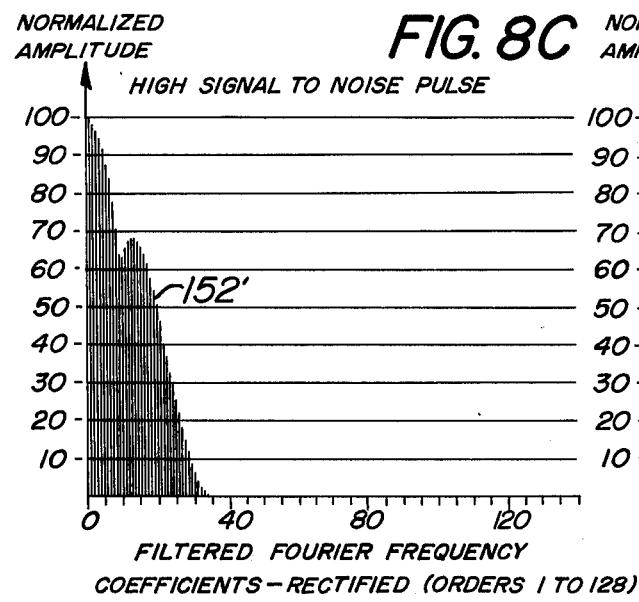
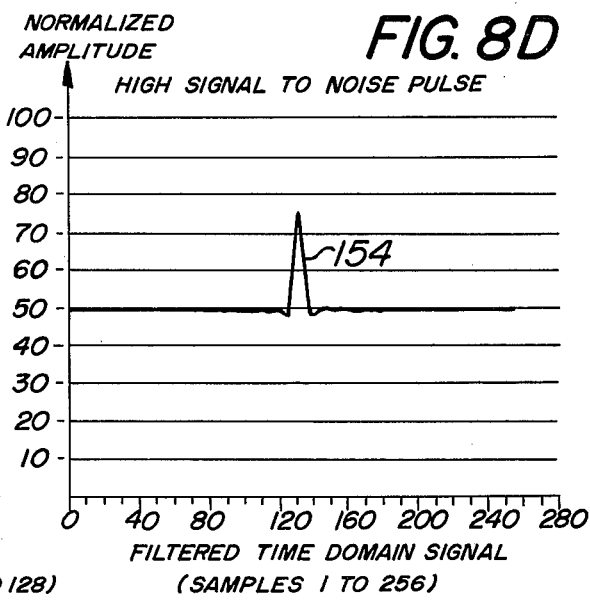

ADAPTIVE PULSE PROCESSING MEANS AND METHOD

The invention relates to a means and method for processing pulse signals occurring at unknown times and having unknown duration present with noise signals, and more particularly to a means and method utilizing orthogonal transform functions for adaptive filtering by selecting orthogonal signal components and inversely transforming the selected components to provide the desired output information.

Heretofore, many devices have been utilized for filtering signals in the time domain, whereby signal frequency components in selected ranges are passed, while the other frequencies are minimized or eliminated. However, the effect of such filtering devices is not maximized where the band width or duration of the incoming signals is unknown and may change from signal to signal. Although feedback systems are utilized for increasing the effectiveness of such filters, such methods also are not totally adaptive to the incoming signal, even though the filtering effect is enhanced. Transformation of incoming signals by orthogonal functions have also been utilized, and components in the transformed domain have been selected for filtering purposes. However, such filtering has also not been adaptive for maximizing the information output when input information, such as pulse signals, occur at unknown times and with unknown durations and amplitudes.

It is therefore, a principal object of the invention, to provide the new and improved means and method for filtering input signals having pulse signals of unknown widths or durations, amplitudes, and times of arrival.

Another object of the invention is to provide a new and improved means and method which is adaptive for determining the presence and delivering information for input signals of unknown widths or durations, amplitudes, and times of occurence.

Another object of the invention is to provide an improved signal filtering means and method and which utilizes orthogonal transformations for analyzing incoming signals for determining the presence of pulse signals and eliminating and minimizing noise signals which are present with the incoming pulse signals.

Another object of the invention is to provide a new and improved signal filtering means and method for receiving and detecting the presence of pulse signals of unknown widths or durations in the presence of noise signals and providing delivery of output signals with minimum processing delay.

Another object of the invention is to provide a new and improved adaptive signal filtering means and method without requiring a prior knowledge of the signal shapes, durations, amplitudes, and times of occurence, and without utilizing reinterative or feedback operations.

Another object of the invention is to provide a new and improved signal filtering means and method which provides an improved signal to noise ratio of typically 10 to 25 db, and an improved measuring accuracy of pulse width, time of arrival and amplitude.

Another object of the invention is to provide a new and improved signal processing means and method for delivering output pulse signals present at its input while discriminating against non-pulse signals and removing distortion from the pulse signals.

The above objects of the invention as well as many additional objects are achieved by providing a signal processing means for pulse signals having terminal means for receiving input signals including pulse and noise signals with the pulse signals occurring at unknown times and having unknown durations and amplitudes. Signals from the terminal means are received by a first input of a signal filtering means which has a controllable filter characteristic for passing signals from its first input to its output responsive to signals received at a second input. A signal analyzing means which also receives input signals derived from the terminal means, delivers output signals to the second input of the signal filtering means for controlling its filter characteristic, so that the signal filtering means delivers signals corresponding to the pulse signals of the input signals at the terminal means, while minimizing delivery of noise signals received at the terminal means.

The signals from the terminal means prior to being delivered to the signal analyzing means are converted from analog form to digital form and then subjected to an orthogonal transformation from the time domain to the orthogonal domain. A preferable orthogonal transformation for rectangular pulse signals is a Walsh transform, providing in digital form the sequency components representing the time domain signals. The signal analyzing means determines from the signal components, information required for providing a transfer characteristic for the signal filtering means to optimize its operation. After the delay required by the signal analyzing means to process the sequency signal components, the sequency signal components are delivered to the filtering means. The filtering means selects those components as determined by the signal analyzing means, which are required for removing noise signals while at the same time passing signals representative of the input pulse signal received at the terminal means.

The filtered sequency components delivered by the filtering means are received by an inverse orthogonal transforming means, which reconverts the signals from the orthogonal domain to the time domain. The time domain signals may then be utilized in digital form or reconverted by a digital to analog converter to the analog form in which the original signal was delivered to the input terminal. Thus, input signals received at the terminal means are passed through the signal processing means, and the output pulse signals present at the input terminal are delivered with the noise signals minimized. The only time elapse between receipt and delivery of the signals is occasioned by the limited time needed by the signal analyzing means to receive and adaptively determine the filter characteristic for the filtering means, prior to the delivery to the filtering means of the signals to be filtered, and the processing time for the filtering means, transformers and converters.

When the processing means is to be optimized for receipt and processing of pulse signals in rectangular form, the orthogonal transformation is preferably a Walsh transform. Under such conditions, the output time domain signals from the digital to analog converter may also be thresholded for reconstructing the output signal to rectangular form. To further this object, the signal analyzing means determines and also provides output time threshold signals to a time thresholding means. The thresholding means provides rectangular output signals with amplitudes corresponding to the amplitudes of the input pulse signals and where desirable with the original DC base level.

The foregoing and other objects and advantages of the invention will become more apparent when the following detailed description of the invention is read in conjunction with the drawing, in which.

Figure 4:
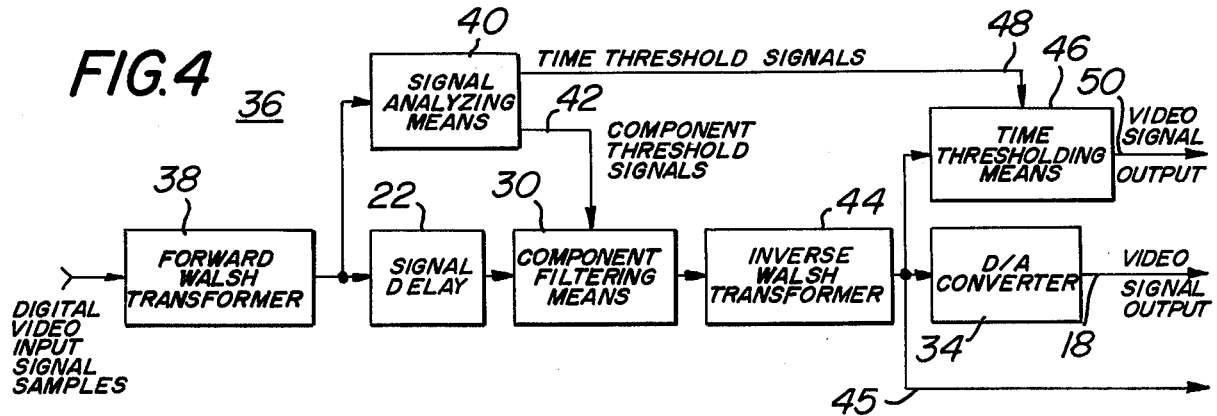
Figure 5A:
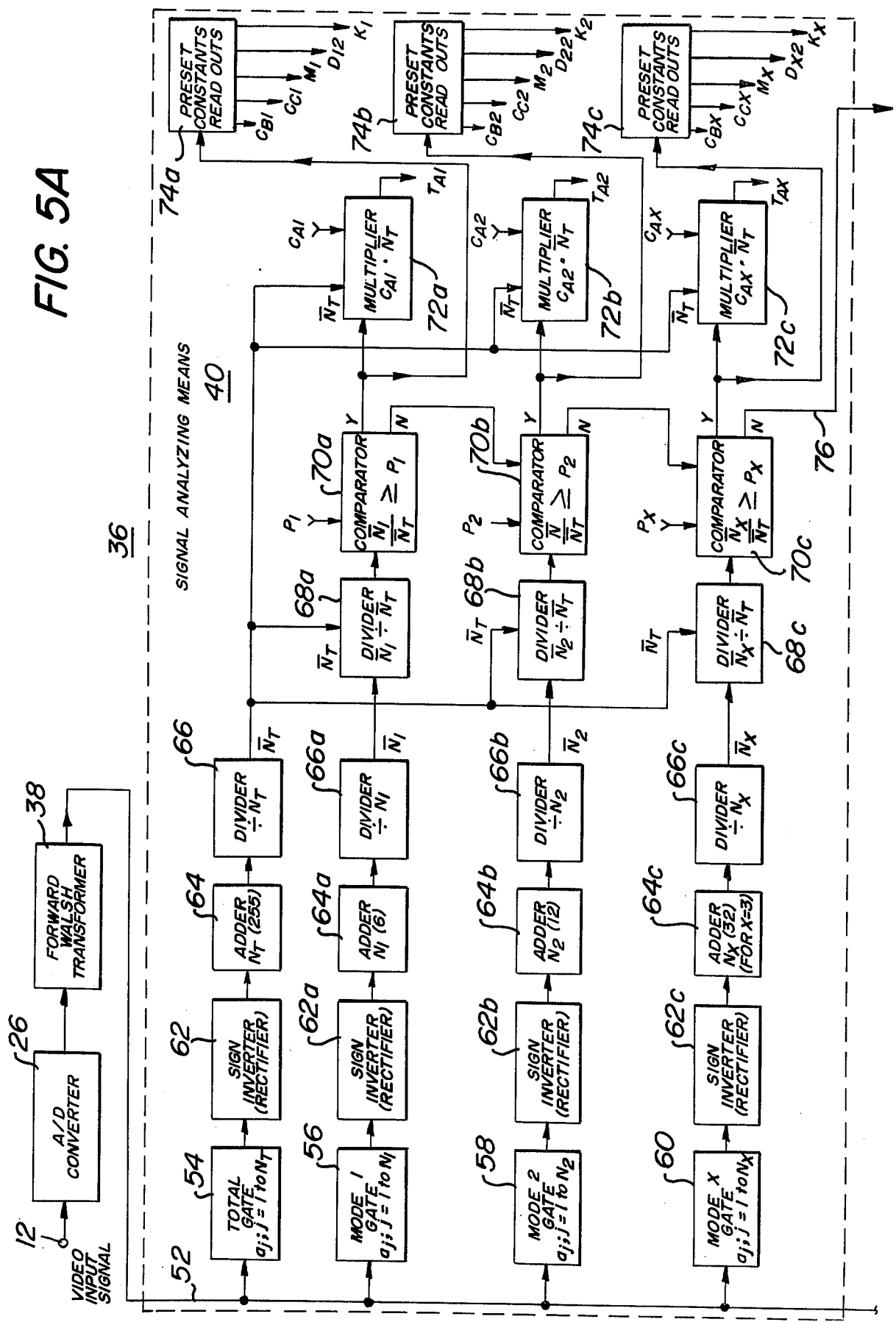
Figure 5B:
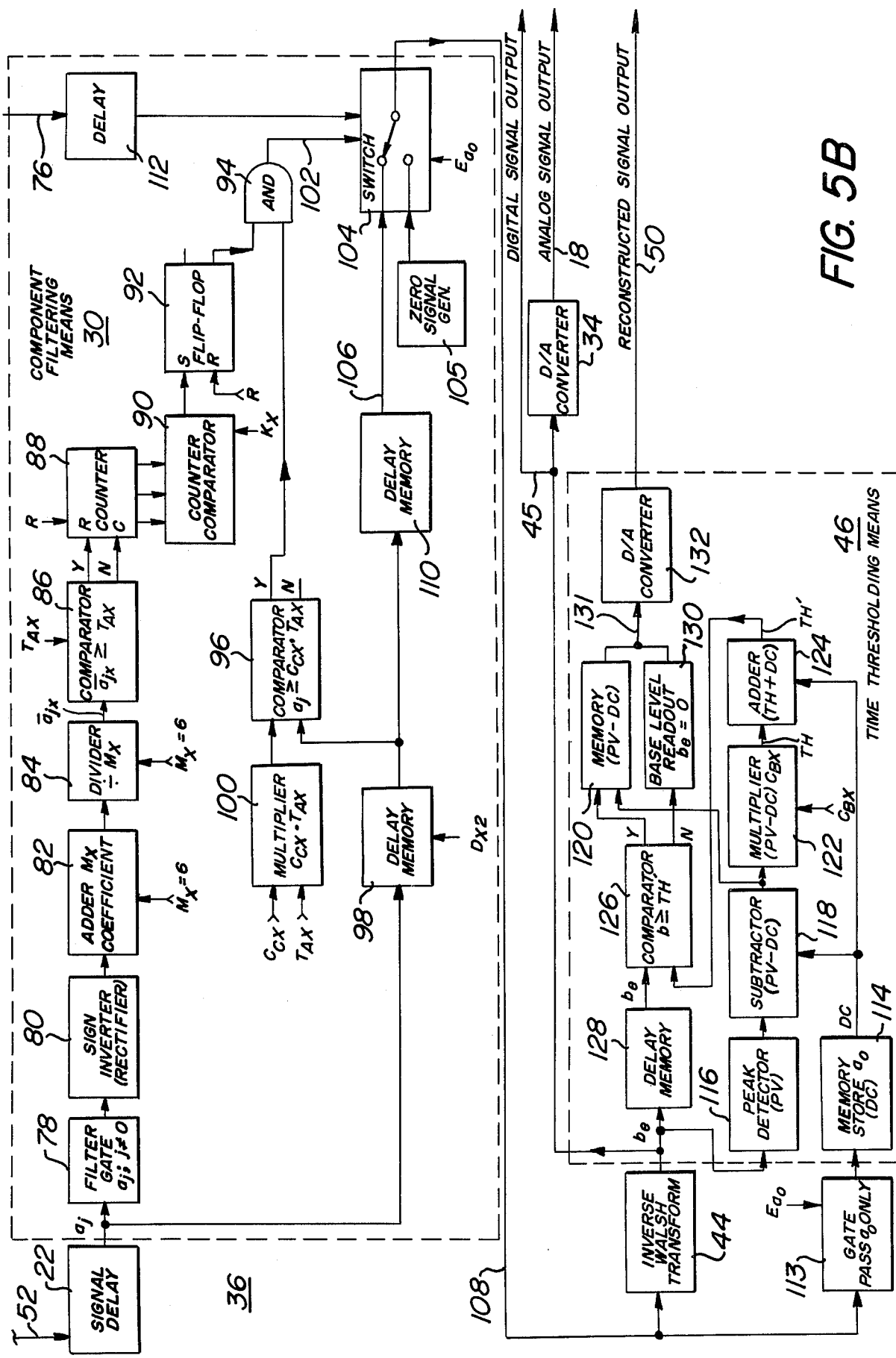

FIG. 4 is a detailed block diagram illustrating still another form of the invention, FIG. 5A is a block diagram illustrating in greater detail the signal analyzing means of FIG. 4, FIG. 5B is a block diagram illustrating in greater detail the component filtering means and time thresholding means of FIG. 4, FIGS. 6A to 6E graphically illustrate the opertion of the invention utilizing a Walsh transform for an input signal including a rectangular pulse with a high signal to noise ratio, FIGS. 7A to 7E graphically illustrate the operation of the invention utilizing a Walsh transform for an input signal including a rectangular pulse with a low signal to noise ratio, FIGS. 8A to 8D graphically illustrate the operation of the invention utilizing a Fourier transform for an input signal including a rectangular pulse with a high signal to noise ratio.

Like reference numerals designate like components throughout the several figures of the drawing.

Figure 1:
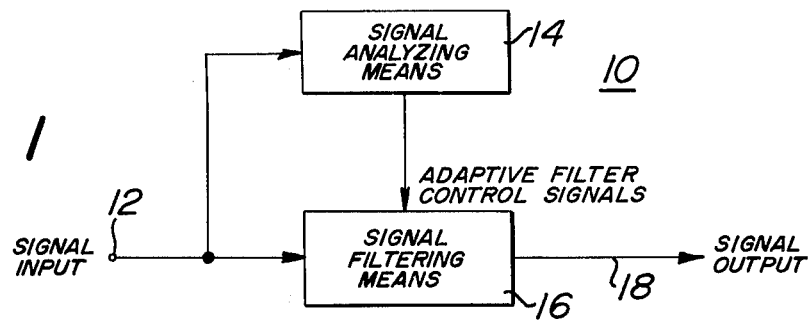
FIG. 1 is a basic block diagram illustrating the invention.

FIG. 1 is a block diagram illustrating a signal processing means 10 embodying the invention. The processing means 10 has an input terminal 12 for receiving signals including pulse and noise signals. Such signals may be in the video range and include radar signals which may be derived from unknown sources having unknown durations, times of occurence and unexpected amplitudes. The signals may also be concurrently received from different sources providing signals with different durations, times of occurence, and amplitudes.

Pulse widths from 0.1 microseconds to 20 microseconds are common in the 2.0 to 12.0 gigahertz band, providing a pulse width range of 200 to 1.

If it is desirable to receive the 0.1 microsecond width pulse, a video bandwidth of 10 megahertz or wider is desirable, although only a 50 kilohertz video bandwidth is required for a pulse having a width of 20 microseconds. Thus, pulses of such long durations are also subjected to the full 10 megahertz of video noise bandwidth. However, such a wide bandwidth is necessary to allow receipt of pulses of varying durations.

The signals received on the terminal 12 are delivered to a signal analyzing means 14 which analyzes the incoming signal to determine pulse presence and whether it is of long or short duration. Upon determining the duration of an incoming pulse signal, as distinguished from the noise signals present, the signal analyzing means 14 delivers an output signal to a signal filtering means 16. The signal filtering means 16 also receives the input signal and has a transfer characteristic which is controlled by the output signal from the signal analyzing means 14. The output signal from the signal analyzing means 14, which is delivered to the signal filtering means 16, adaptively controls the filter transfer characteristic of the signal filtering means 16 depending upon the presence of an input signal and the duration or pulse width of the input signal. The signal filtering means 16, subjects its input signals to its controlled filter characteristic and provides filtered signals to the signal output line 18 which signals correspond to the pulse signals received at the terminal 12 but with the noise signals minimized.

Thus, although signals of different pulse widths are received at the signal input terminal 12, the characteristic of the signal filtering means 16 is adaptively controlled to effectively increase or decrease the signal transfer bandwidth. When a signal of long duration or wide pulse width is received at the input terminal 12, the bandpass characteristic of the signal filtering means 16, is adaptively narrowed to pass the incoming pulse signal, but to reject the noise signals outside the bandwidth of the received pulse signals. On the other hand, when a signal having a very short duration is received at the input terminal 12, and a wide bandwidth is required to pass the pulse signal, the analyzing means 14 delivers a control signal to the filtering means 16, adapting it to provide a wide band pass characteristic to allow passage of the pulse signal as well as any noise which may be present in the pass band. However, the advantages of the narrow pass band for long duration signals is not lost due to the ability of the signal processing means, to adaptively alter its filter characteristic upon the occurence of signals of long duration.

Figure 2:
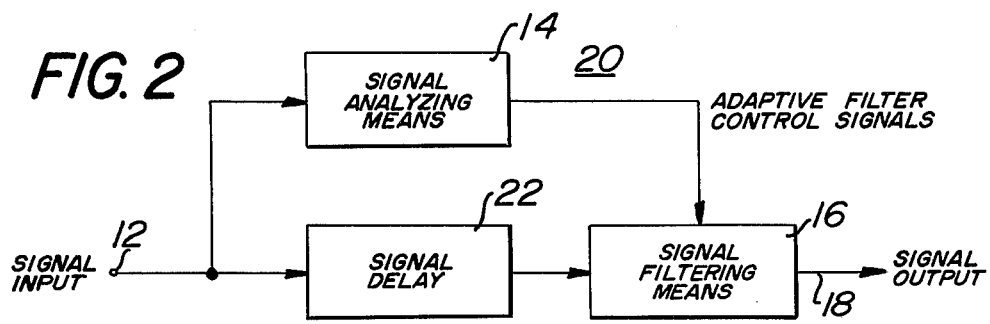
FIG. 2 is a block diagram, of a modified form of the invention.

FIG. 2 is a block diagram illustrating a signal processing means 20 which is modified with respect to the device 10 by including a signal delay 22 which is positioned between the signal input terminal 12 and the input to the signal filtering means 16.

Since different signals arrive at different times at the input terminal 12, and are sequentially received by the signal analyzing means 14, the output signal of the analyzing means 14 changes adaptively with the received signals. The signal delay 22 delays the arrival of the signals from the input terminal 12 to the signal filtering means 16, so that the signals are received at the signal filtering means at the same time that the corresponding control signals are provided by the signal analyzing means 14 to the signal filtering means 16. The signal delay 22 allows the time required for the signal analyzing means 14 to generate its control signals and for the signal filtering means to alter its transfer characteristic before the delivery of the corresponding signals to the signal filtering means 16.

As signals are received in time sequence at the input terminal 12, corresponding signals are delivered to the output line 18 in the same sequence and only after the delay required for the analyzing and filtering operations of the signal processing means.

The signal processing means 10 and 20, thus, operate to reduce the effective bandwidth in the presence of desirable pulse signals to minimize delivery of noise signals at their output lines 18, while increasing the bandwidth pass characteristic to the extent required to pass only the desired pulse signals and minimize the noise signals outside of the passes band. In the absence of a desirable pulse signal, the signal processing means minimizes the delivery of output noise signals.

Figure 3:
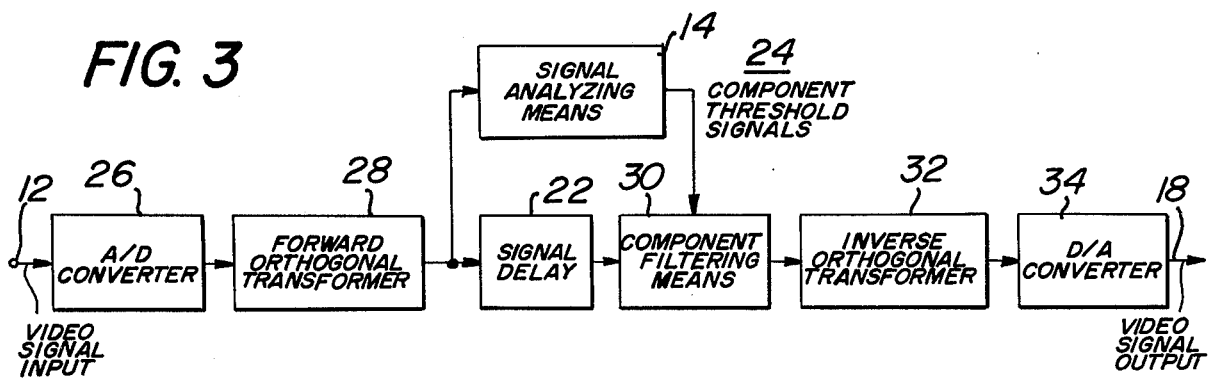
FIG. 3 is a detailed block diagram illustrating another form of the invention.

FIG. 3 is a block diagram illustrating in greater detail a similar processing means 24 which is in modified form of the signal processing means 20 of FIG. 2.

The input signals received at the terminal 12 of the signal processing means 24, are sampled by an analog to digital converter 26, and delivered to a forward orthogonal transformer 28. The orthogonal transformer 28 transforms the digital time domain signals to the orthogonal domain. Thus, for example, if the orthogonal transform is a Walsh transform, the signals are tranformed to provide sequency components in the orthogonal domain, while if a Fourier transform is utilized, the transformed signals are frequency components. Other transforms may also be utilized for the particular advantages which they may offer. The orthogonal signals are delivered to the signal analyzing means 14 for processing and through the delay 22 to a component filtering means 30.

The component filtering means 30 receives output signal from the signal analyzing means 14 and passes selected orthogonal domain components which are determined by the control signals from the signal analyzing means 14. The component filtering means 30, thus, passes certain orthogonal signal components for delivery at its output, while suppressing other components to provide an adaptive pass characteristic which is altered by control signals from the signal analyzing means 14. The filtered output signals from the component filter means 30 are delivered to an inverse orthogonal transformer 32 which has a transform characteristic which is the inverse of the forward characteristic of the orthogonal transformer 38. The transfomer 32 transforms the set of selected orthogonal signal components from the orthogonal domain into the time domain. The output signal is a time varying signal which corresponds to the signal received at the input terminal 12 and subjected to the pass characteristic of the component filtering means 30 for passing the pulse signal present while minimizing noise.

The signal provided by the inverse orthogonal transformer 32 may be used in the digital form or converted to the analog time varying form by a digital to analog converter 34, which delivers a filtered video signal to the output line 18.

In operation with a video signal received at the input terminal 12, it is sampled by the analog to digital converter 26 at a rate required to provide a signal bandwidth adequate to process signals having the narrowest duration or pulse width which are to be processed by the means 24. To achieve this, the sampling rate must be high enough to produce at least 2 samples for the shortest expected pulse and preferably 4 samples per pulse. Thus, if the pulse duration or width has a range to 100 to 1, then either 200 or preferrably 400 samples will represent the longest pulse signal. Considering four samples per pulse, pulses having a duration as short as 0.1 microseconds can be sampled with a 40 megahertz sample rate or 1 sample every 25 nanoseconds provided the video input bandwidth is a minimum of 10 megahertz.

For the purpose of obtaining 400 samples, for the longest pulse to be received in the example being considered, and with a sampling rate of 40 megahertz, a time interval or time block of 10 microseconds would be required. At the lower sampling rate of 2 samples for the shortest pulse of 0.1 microseconds to be processed, 200 samples would be derived during a time interval or time block of 10 microseconds. Of course, the sampling rate utilized will vary for variations of the resolution which is to be achieved and the range of pulse widths or durations which are to be accommodated with maximum processing enhancement. For the embodiment illustrated, the number of samples $N_T$ provided for the interval or time block, is any integral above 32 given by the expression $N_T = 2^Y$, where $Y$ is an integer greater than 5. $N_T$ is typically 128, 256, 512 or 1,024, but can be higher without theoretical limit. Increasing $N_T$, provides higher resolution and less distortion of the input signal. With 256 samples taken at a 20 megahertz rate, the time interval or block during which such samples are taken is 12.8 microseconds.

For the 256 samples provided in the time interval or block specified above and delivered to the forward orthogonal transformer 28, the transformer delivers a predetermined number of 256 orthogonal signal components, either in time sequence, or concurrently over parallel output lines. As previously noted, the information appears in digital form, and is expenditiously handled in this form, although the orthogonal transformers 28 and 32 may be provided for receiving analog time domain samples and delivering analog output signal in the orthogonal signal domain.

The signal analyzing means 14 and component filtering means 30 process the orthogonal signal components, and selected components are delivered through the component filtering means 30 to the inverse orthogonal transformer 32. The information delivered by the transformer 32 is in the time domain, and, if in digital form, can be reconverted to analog form by the digital to analog converter 34 for delivery to the out line 18. On the other hand, if the orthogonal transformer 32 delivers output information in the analog form, it may, as desired, be delivered directly to line 18, or converted by a digital to analog converter to digital form.

In considering the case where the orthogonal transformers 28 and 32 utilize the Walsh transform, each time domain block is converted into $N_T$ orthogonal signal components of N discrete sequencies, where N is equal to $N_T/2$. The Walsh signal components represent the function $f(t)$ of the sampled time domain signal by the following series of components, each having a sequency n increasing in order from O to N:

$$f(t) = a_0 WAL(0,t) + a_1 SAL(1,t) + b_1 CAL(1,t) + a_2 SAL(2,t) + + b_2 CAL(2,t) + \ldots a_{n=N-}SAL(n=N,t) + b_{n=N}CAL(n=N,t) \quad (1)$$

where $$a_0 = \int_0^1 f(t)dt = DC\ average \quad (2)$$

$$a_n = \int_0^1 SAL(n,t)f(t)dt \quad (3)$$

$$b_n = \int_0^1 CAL(n,t)f(t)dt \quad (4)$$

and $n = 0, 1, 2...N$

For all of the above cases, the integral is replaced by a discrete summation over $N_T$ samples. The sequency order is defined as one-half of the average number of zero crossings per second of the corresponding Walsh function. For a description of Walsh functions, refer to Henning F. Harmuth, "Transmission of Information by Orthogonal Functions," Second Edition, Springer-Verlang, New York, 1968, pages 3 to 5.

The orthogonal transformers 28 and 32 may be of the type which after receiving all of the signal samples of a time block, provides a series of output signals on an output line, equal to the number of input sample signals for the block, and over a time duration equal to the sampling time for the block. Thus, if 256 time domain signals are received by the transformer 28, then 256 sequency signals are subsequently delivered over an equal time interval. The Walsh sequency signals are thus delivered by the transformer 28, and in order of increasing sequency from $n = 0$ to $n = N$. It is noted that each sequency above 0 has two components SAL and CAL so that the total number of components $N_T$ for $N = 128$ is $N_T = 256$. This is the same number ($N_T = 256$) of time domain samples per block.

The serial data stream of sequency domain components are received by the signal analyzing means 14, where they are processed to provide filter control signals to the filtering means 30. After the delay provided by the signal delay 22, the series of sequency domain components are filtered by the component filtering means 30 and selected components are delivered to the inverse orthogonal transformer 32. The transformer 32 provides output time domain signals at the same rate, but delayed with respect to the time domain signals delivered to the forward orthogonal transformer 28. If the component filtering means 30 passes all of the $N_T$ sequency domain elements, then the time domain signals delivered by the inverse orthogonal transformer 32 will be identical to the time domain signals received by the forward othogonal transformer 28, except for the time delay. When an input pulse signal in the presence of noise, is delivered to the terminal 12 of the processing means 24, the component filtering means 30 does not pass all sequency components, thus providing the filtering action whch is dependent upon the control signals delivered by the signal analyzing means 14.

FIG. 4 is a block diagram illustrating a modified form of the signal processing means 24. As previously described, digital signal samples are produced by the converter 26 from signals derived from the input terminal 12. The digital signals are received by the forward Walsh transformer 38 which provides a serial data stream of sequency domain components as described in connection with the signal processing means 24. The sequency components are received by a signal analyzing means 40 which delivers over its output line 42 control signals to the component filtering means 30 in the form of component threshold signals. The control signals from line 42 control the filtering characteristic of the filtering means 30, so that selected sequency components are delivered to an inverse Walsh transformer 44. The inverse Walsh transformer 44 delivers output signals in the time domain corresponding to the sequency signals which it receives for that time interval block. The signals are delivered in digital form to an output line 45 and to the converter 34. The digital to analog converter 34 converts the signals from the Walsh transformer 44 to analog form and delivers them to output line 18.

The signals from the transformer 44 are also delivered to a time thresholding means 46. The thresholding means 46 receives control signals from the signal analyzing means 40 over a second output line 48. The control signals provide time threshold signals for the time domain signals received by the thresholding means 46. The time thresholding means 46 reconstructs the signals which it receives to provide a video signal to the output line 50 with pulses of rectangular form having an amplitude corresponding to the pulse signals received at the input terminal 12 of the processing means 36 with or without the restored DC level of the input signal at the terminal 12.

The signal processing means 36, by utilizing the Walsh transform is particularly adapted for effectively treating rectangular pulse signals. The signal analyzing means 40 operates in the sequency domain and is independent of input DC signal levels. The time thresholding means 46 which receives time domain signals from the inverse Walsh transformer 44 obtains the DC level information and provides output signals with a corresponding baseline level over its output line 50.

FIGS. 5A and 5B are block diagrams of the signal processing means 36 illustrated in FIG. 4, with FIG. 5A illustrating in greater detail the signal analyzing means 40, while the FIG. 5B illustrates in greater detail the component filtering means 30 and the time thresholding means 46.

Referring first to FIG. 5A, the data stream of sequency domain components from the forward Walsh transformer 38 are delivered to an input line 52 of the signal analyzing means 40. The signals on line 52 are delivered to the input of a total gate 54 and a plurality of mode gates 56, 58, and 60. The number of mode gates 56, 58, and 60, depends upon the total number X of operational modes $x$ of the analyzing means 40. In the embodiment illustrated, the total number of modes X is 3, although the number of modes is unlimited and may include one or more modes depending upon design requirements.

The total gate 54 passes each of the received Walsh sequency components or coefficients $a_j$ for each time block, in increasing order of its sequency $n$, except for the sequency component $a_o$, which represents the DC average level of the sampled time domain signal. The sequency signals actually delivered are in digital form, and provide a number representing the value of each of the coefficients i $a_j$, where $j$ is an integer increasing from 1 to $\overline{N}_T$. Since, in the example provided, the total number of sequency components is 256, the actual number of sequency components which are passed by the total gate 54 is equal to 255, taking into account the exclusion of the $a_o$ component.

The total gate 54 delivers its output signals to a negative sign inverter 62 which acts to rectify only the negative coefficients by making all negative values positive. The rectified signal components are then delivered to an adder 64 which provides at its output a signal representing a total value or sum of the rectified coefficients of the sequency components. This total is received by a divider 66 which divides the sum by $N_T$, to provide an output signal $\overline{N}_T$ having a value equivalent to the average of all rectified coefficients of the sequency components excluding the $a_o$ component.

At the same time that the sequency components are being passed by the total gate 54, the mode gates 56, 58, and 60 also receives and pass the signals representing the sequency components, but also excluding the initial $a_o$ component. The mode gate 56 corresponding to the first operational mode ($x = 1$), passes the sequency signals $a_j$, for $j = 1$ to $N_1$, while gate 58 corresponding to operational mode 2, passes the sequency components $a_j$ for $j = 1$ to $N_2$, and the mode gate 60 representing the last mode X, passes sequency components $a_j$, for $j = 1$ to $N_X$. The numbers $N_1$, $N_2$, and $N_X$ are determined bythe number of operational modes utilized by the signal analyzing means 40 and control the manner of operation of the signal processing means 36 which will become more evident when the operation of the processing means is described. For the purpose of our example, taking $X = 3$, in which 3 operational modes are utilized for the signal analyzing means 40, typical values for $N_x$ $_{/ are} N_1 = 12$, and $N_3 = 32$. This means that mode gate 56 will pass the sequency component coefficients $a_1$ to $a_6$, while mode gate 58 passes the coefficients $a_1$ to $a_{12}$, and mode gate 60 passes coefficients $a_1$ to $a_{32}$ during each time block.

The coefficients passed by the gate 56 are received by a sign inverter 62a, an adder 64a, and a divider 66a, which operate to add the rectified or absolute value of each of the component coefficients and then divide the sum by $N_1$. The number $N_1$ of added coefficients, is 6 for mode 1. The output signal from the divider 66a is the average value $\overline{N}_1$ of the first $N_1$ (mode 1) sequency component coefficients. The output from the divider 66a is delivered to a divider 68a which also receives the average total value $\overline{N}_T$ provided by the divider 66. The divider 68a provides an output which is the ratio $\overline{N}_1/\overline{N}_T$, and delivers this value to a comparator 70a.

The comparator 70a compares the first mode ratio $\overline{N}_1/\overline{N}_T$ to one of the preprogrammed threshold constants $P_X = P_1$ for the operational mode 1. The threshold constants $P_X$ have values between 0.8 and 5.0 depending upon the operational mode. The comparator 70a delivers a YES output signal to a multiplier 72a, if the ratio $\overline{N}_1/\overline{N}_T$ is greater than or equal to $P_1$, and a NO signal to a mode 2 comparator 70b if the ratio is less than $P_1$. The delivery of a YES signal to the mode 1 multiplier 72a, activates it to provide a mode 1 output threshold signal $T_{A1}$. The output signal $TA_1$ provided with the mode 1 activation, is a product of the average total component coefficients $\overline{N}_T$ received from the divider 66 and a preprogrammed constant $C_{A1}$ which is provided for determining the sequency domain threshold for operational mode 1.

The constants $C_{AX}$ vary from 0.8 to 4.0 depending upon the operation mode X, and are selected according to the sensitivity to false alarm trade off desired, and the input video bandwidth. Typical values selected are described below in connection with the description of the component filtering means 30 of FIG. 5B.

The delivery of a YES signal by the comparator 70a, also provides an activating signal to a preset constant read out device 74a which provides a plurality of constants $C_{B1}$, $C_{C1}$, $M_1$, $D_{12}$, and $K_1$, for delivery with the threshold value $T_{A1}$ to the component filtering means 30 and the time thresholding means 46.

The mode gate 58 like the mode gate 56, is followed by a sign inverter 62b, adder 64b, divider 66b, divider 68b and comparator 70b, which operate in a similar manner to add the component coefficients passed by the mode gate 58, divide the total by the number of added coefficients $N_2$ to provide the average value $\overline{N}_2$ for mode 2. The divider 68b also provides the ratio $\overline{N}_2/\overline{N}_T$ in a similar manner, and delivers it to the comparator 70b for the comparision with the preprogrammed threshold $P_2$ for mode 2. The thresholdconstant $P_2$ as noted above has a value between 0.8 to 5.0, but ordinarily has a value which is lower than the value of the constant $P_1$ for the operational mode 1. The comparator 70b, however, does not deliver an output signal, unless it first receives a NO signal from the comparator 70a. As noted above if a NO signal is delivered by the comparator 70a, the operational mode ($X=1$) is not activated due to the multiplier 72a and read out 74a not being activated. The mode 2 comparator 70b provides a YES output signal if its ratio $\overline{N}_2/\overline{N}_T$ is greater than or equal to the threshold constant $P_2$, while it delivers a NO output signal to a comparator 70c if this ratio of less than $P_2$.

If a YES output signal is provided by the comparator 70b, the second mode multiplier 72b and the preset constant readout 74b are activated. The multiplier 72b provides an output sequency domain threshold signal $T_{A2}$ which is a multiple of the average total value $\overline{N}_T$ and a preprogrammed constant $C_{A2}$. The preset constant readout 74b, also provides output control signals $C_{B2}$, $C_{C2}$, $M_2$, $D_{22}$, and $K_2$ for delivery to the component filtering means 30 and time thresholding means 46 for operation in mode 2.

At the same time that of the gates 54, 56, and 58 are passing sequency component coefficients received over line 52, the mode gate 60 also passes signals to a sign inverter 62c which delivers signals to the adder 64c. In the example given, 32 coefficients are added in mode $X = 3$, and delivered to the divider 66c which divides the value of the added coefficients by $N_X$ the number of added coefficients (in this case 32) to provide the average sequency component coefficient value for the X mode represented by $\overline{N}_X$. The value is delivered to the divider 68c which also receives the average total value $\overline{N}_T$. The divider 68c provides the ratio $\overline{N}_X/\overline{N}_T$ to the comparator 70c which is activated only by the delivery of a NO signal from the comparator 70b.

The comparator 70c receives a NO signal only if the lower mode comparators each fail to provide a YES outut signal, and in the absence of sequency domain threshold signals and time domain threshold signals provided by such lower modes. Under such circumstances, the comparator 70c delivers a YES output signal if its generated ratio is greater than or equal to the preprogrammed threshold level $P_X$ for the mode X. This results in this activation of a multiplier 72c and a preset constants readout 74c. Activation of the multiplier 72c and preset constants read out 74c results in the generation of respective output threshold and constant signals $T_{AX}$, $C_{BX}$, $M_X$, $D_{X2}$ and $K_X$ for mode X.

The failure of the comparator 70c to deliver a YES output signal results in a NO output signal over line 76. As noted above, NO output signals when generated are delivered in turn to the next higher mode comparator. When the highest mode comparator, such as the comparator 70c in this case, provides a NO signal, the signal is delivered over line 76 to the component filtering means 30. The delivery of such a signal indicates that the signal analyzing means 40 has failed to determine the existance of a pulse signal of any width in the time interval or block being processed by the signal analyzing means 40.

Referring now to FIG. 5B, the component filtering means 30 receives at the signal delay 22, the serial data stream of sequency domain components $a_j$, with $j$ increasing from 0 to $N_T$. The signal delay 22 delays the sequency domain components for a time of at least $N_T + 1$ samples and typically up to 1.25 $N_T$ samples. For a Walsh transformer providing 256 sequency components coefficients, a delay of 320 samples is typical. A minimum delay of $N_T$ samples is necessary to appropriately analyze all sequency domain component coefficients, and longer delays are only necessary to provide for the computation time for the signal analyzing means 40.

The delayed signals from the delay 22 representing the sequency component coefficients $a_j$ are delivered to a filter gate 78 which passes all of the components $a_j$ except for the component $a_o$ representing the DC average value of the video signal. The signals from the gate 78 are delivered to the negative sign inverter 80 which rectifies negative signals to produce positive signals and delivers such positive signals to an adder 82. The adder 82 is of the type which serially receives and adds a number of coefficients $a_j$. The number of coefficients added is determined by the signal $M_x$ delivered to it. $M_x$ is an integer which is a function of the operational mode activated by the signal analyzing means 40. Thus, if the first operational mode is activated, then the integer value $M_1$ is provided to the adder 82. For other modes, a corresponding value $M_x$ is delivered. A respective value $M_x$ is provided for each time interval block. The values of $M_x$, are also a function of the number of integrated coefficients for the respective modes $N_x$. For the values $N_1 = 6$, $N_2 = 12$ and $N_3 = 32$, where $X = 3$ for 3 operational modes, the values of $M_x$ used are typically $M_1 = 4$, $M_2 = 6$ and $M_3 = 8$.

With a value of $M_x$ equal to 6, the adder 82, which is of the sliding type, adds a series of 6 sequentially ordered coefficients, dropping an earlier ordered coefficient as a later ordered coefficient is added. Thus, if the coefficient added has a higher value than the coefficient dropped, the sum of the 6 coefficients will increase, while if the incoming coefficient has a lower or zero value, the total of the added coefficients will decrease. The total value of the added coefficients is delivered by the added 82, each time a new coefficient is added, to a divider 84 which divides the total value by the integer $M_x$ (6 in this case) to provide an average value $\bar{a}_{jx}$ which is delivered to a comparator 86. The average value $\bar{a}_{jx}$ is compared to the sequency domain threshold $T_{AX}$ derived from the multiplier 72 of the energized operational mode of the signal analyzing means 40. As explained above in connection with FIG. 5A, for typical cases when $M_1 = 4$, then $T_{A1} = 1.5 \bar{N}_T (C_{A1} = 1.5)$, and when $M_2 = 6$, then $T_{A2} = 1.2 \bar{N}_T (C_{A2} = 1.2)$, etc. with the threshold decreasing with increasing mode.

The value $\bar{a}_{jx}$ is compared with $T_{AX}$, and a YES output signal is delivered by the comparator 86 to reset the counter 88 when this value is equal or greater than $T_{AX}$. When the value is less than $T_{AX}$, a NO output signal is delivered to the counter 88 increasing its count. The count of the counter 88 is delivered to a counter comparator 90 which also receives an input signal $K_x$. $K_x$ is a preprogrammed constant derived from the activated preset constant readout 74 of the signal analyzing means 40. The constant $K_x$ sets the maximum number of consecutive times that the rectified integrated normalized sequency component coefficient $\bar{a}_j$ must be below the threshold $T_{AX}$ for the counter-comparator 90 to deliver an output signal setting a flip flop 92. The constant $K_x$ has a value from 1.0 to 10 and typically has a value of 5. This allows five successive below threshold integrations of the adder 82 before the counter-comparator 90 delivers an output signal setting the flip flop 92. The value of $K_x$, which is always a integer, is smaller for smaller values of $M_x$ and larger for larger values of $M_x$. The flip flop 92 is reset at the beginning of each time interval or block. In this state, it delivers a gating signal to the input of an AND gate 94. The gating signal is removed when the flip flop 92 is triggered to its set condition upon the delivery of a signal from the counter-comparator 90 when the count of the counter 88 exceeds the value $K_x$.

The AND gate 94 also receives a signal from the YES output line of a comparator 96. The comparator 96 receives the serial data stream of sequency domain component coefficients $a_j$ from the signal delay 22 through a delay memory 98. The delay memory 98 provides a delay which is determined by the constant $D_{x2}$ derived from the activated mode of the signal analzying means 40 for the respective time interval or block. The constant $D_{x2}$ is a number representing a delay for the activated mode $x$ which compensates for the variable delay associated with the processing in mode $x$ of the component filtering means 30 and typically is equal to $M_x$ samples and must be large enough to accommodate the computation time for the component filtering means 30.

The comparator 96 also receives a threshold signal from a multiplier 100 which receives and mutliplies the constants $C_{Cx}$ and $T_{Ax}$ derived from the signal analyzing means 40. The threshold constant $T_{Ax}$ as noted above, is determined by the activated mode for the time interval block varying between 0.8 $\bar{N}_T$ and 4.0 $\bar{N}_T$. The constant $C_{Cx}$ varies from 0.8 to 3.0, and sets the sequency component filtering threshold as a multiple of $T_{Ax}$ and the constant $C_{Ax}$, according to the sensitivity to false alarm tradeoff desired for the operational mode. When $C_{Cx}$ equals 1, the sequency component threshold is equal to $T_{Ax}$, which is a function of $C_{Ax}$ and $\bar{N}_T$ previously noted. A typical value used for $C_{Cx}$ is 1.5, which results in passing strong sequency components by the component filtering means 30 even when the integrated sum of $M_x$ values is below the $T_{Ax}$ thresholds. The values of $C_{Cx}$ tend to be lower than 1.5 for long pulses (large values of $M_x$) and tend to be higher than 1.5 for short pulses (small values of $M_x$). This is because longer pulses often have only one or two stronger sequency components which are passed even though the integration of over perhaps 6 $M_x$ coefficients is below the threshold $T_{Ax}$.

The comparator 96, which receives the product of the constant $C_{Cx}$ and the threshold value $T_{Ax}$, delivers a YES output signal for each sequency component coefficient $a_j$ which is greater than or equal to this product, while delivering a NO signal for all coefficients below said product value for the time interval block being processed. Upon each delivery of a YES output signal by the comparator 96, in the presence of an output signal from the flip flop 92 to the AND gate 94, the AND gate 94 delivers an output signal on line 102 to a switch gate 104. This conditions the switch 104 to assume its ON state and to pass the signals received over line 106 to an output line 108. The signals on line 106 are the serial stream of sequency domain component coefficients $a_j$ received from the delay memory 98 through a delay memory 110. The delay memory 110 provides a delay sufficient to compensate for the processing time of the compensator 96 and gates 94 and 104 so that the energizing signal on line 102 is delivered at the same time as the corresponding component coefficient for effecting its passage through the switch 104. In the absence of an output signal on line 102, the switch 104 is in its OFF state and receives signals from a zero level signal generator 105 for delivering zero output signal to the line 108.

The switch 104 also receives the NO output signals from the last comparator 70c of the signal analyzing means 40 over line 76 through a delay 112. The presence of an output signal on line 76 indicates that the signal analyzing means 40 has not detected the presence of a pulse signal in the time interval block. The delay 112 retards the signal over line 76 to the switch 104 so that it is received just after the arrival of the sequency component coefficient $a_o$ of the time block, at which time it activates the switch 104 to its OFF state preventing the delivery of any of the higher order sequency component coefficients to the line 108. The sequency component coefficient $a_o$ which provides the DC level of the time domain signal is delivered in each case by the switch 104, which is activated by a enabling pulse $E_{a_O}$ at the time the coefficient $a_o$ arrives. This serves to preserve information with regard to the DC average level of the input signal even in the absence of a detected pulse signal.

The signals delivered over the line 108 are received by the inverse Walsh transformer 44 and a gate 113. The gate 113 receives a gating signal $E_{a_O}$ during each time interval block for allowing the passage of the initial sequency component $a_o$, while blocking all other sequency components. The sequency component $a_o$ is delivered to and stored by a memory 114 of the time thresholding means 46 for providing the DC average value of the input signal.

The inverse Walsh transformer 44 delivers in timed sequence, a serial data stream of time domain elements $b_e$ in response to the sequency domain components delivered to the inverse Walsh transformer 44. Thus, for the receipt of the 256 Walsh components representing the time interval block, the Walsh transformer 44 delivers a timed series of 256 corresponding time domain ordered signals.

The signals from the Walsh transformer 44 are received by a peak detector 116, which determines and stores the peak value (PV) of the time domain elements received during the time interval block. After this determination, the peak value PV is delivered to a substractor 118 from which the DC value derived from the memory 114 is substracted. The difference PV − DC is delivered for storage during the time interval block to a memory 120 and to a multiplier 122.

The multiplier 122 receives a value $C_{Bx}$. This is a preprogrammed constant from the signal analyzing means 40, which has a value depending upon the activated operational mode. This constant is used to calculate the time domain threshold TH and can vary from 0.1 to 0.999. The constant $C_{Bx}$ sets a threshold between the base line DC average value and the time domain peak value PV. The constant $C_{Bx}$ is set high for modes having large values of $N_x$ (corresponding to shorter pulses) and low for modes having small values of $N_x$ (corresponding to longer pulses), and in accordance with pulse amplitude expectancy to maximize detection probability and minimize pulse detection error.

The product of the difference (PV − DC) and the constant $C_{BX}$, provides the pulse threshold value TH, which is delivered to an adder 124. The adder 124 adds the threshold value TH to the DC average level derived from the memory 114 to provide the composite threshold level TH'. The composite threshold level TH' is delivered to a comparator 126.

The comparator 126 receives the time domain elements $b_e$ from the Walsh transformer 44 through the delay memory 128. The delay memory 128 provides a delay which is sufficient to allow the time thresholding means 46 to compute the composite threshold TH' prior to delivery of the first time element $b_e$ to the comparator 126.

The comparator 126 receives, in turn, each of the elements $b_3$, from $b_1$ to $b_{256}$, for comparison with the composite threshold TH'. With the delivery of each element $b_e$, the comparator 126 delivers either a YES output signal or a NO output signal. Where the amplitude of the element $b_e$ is equal to or greater than the composite threshold TH', a YES output signal is delivered to the memory 120, while in each case, where the amplitude is less than the threshold value TH' a NO output signal is delivered to a base level readout 130.

With the delivery of an output signal to the memory 120, the memory 120 delivers to line 131 an output signal having an amplitude equal to (PV − DC). In each instance, where a NO output signal is delivered to the base level readout 130, a signal of zero value is delivered to the line 131. The signals delivered on the output line 131 provide reconstructed time domain signals with pulse signals represented in rectangular configuration and with a O DC base line. Such output signals, which are in digital form, may be utilized for accurately determining the pulse duration or width and relative time of occurence of the pulse. Such signals are delivered through a digital to analog converter 132 to an output line 50, providing the reconstructed threshold signals in analog form as a function of time.

The output signals from the inverse Walsh transformer 44 are also provided, prior to the processing of the time thresholding means 46, over the line 45 directly from the Walsh transformer 44. The digital to analog converter 34 converts such digital signals to analog form for providing signals on the output line 18 which have not been subjected to time thresholding.

Although as described above, the reconstructed signal on line 50 is provided with a 0 DC base level, the output signal also may be provided with the true DC level by modifying the time thresholding means 46. In this case, the memory 120 receives and stores the peak value PV from the peak detector 116, while the base level readout 130 received the DC value from the memory 114 for each time interval block. The line 131 will then receive a peak value signal PV each time the comparator 120 delivers YES output signal and a DC level signal when a NO output signal is provided to the base level readout 130. Such information can again be converted to an analog signal which presents a reconstructed signal having a DC level and rectangular pulse signals with peak values PV.

It is to be understood that the signal processing means 36, is provided with clock pulses for timing the operation of each of its components, enabling signals for conditioning the operation of components, and resetting signals for resetting flip-flops, counters and other devices, as required, and for clearing and conditioning the device for receipt and processing of signals, and for operation in succeeding time interval blocks.

In further considering the operation of the signal processing means 36 and the method of the invention, refer to FIG. 6A which discloses a video input signal 136 occurring within a time interval block. The amplitude of the signal 136 is normalized on a scale of 0 to 100 for the purpose of illustration. The sampling rate is 20 megahertz providing 256 time domain samples in a time interval block of 12.8 microseconds. Of course, different sampling rates, numbers of samples and time interval blocks may be utilized to serve different requirements and design considerations.

The input video signal 136 in FIG. 6A contains a clearly defined pulse signal 138 with a high signal to noise ratio. On the other hand, FIG. 7A illustrates a noisy signal 140 in which a less clearly discernable pulse signal 142 is present. The signal 142 has a low signal to noise ratio and is received by the signal processing means for descriminating between the pulse signal and the noise presented.

When a video signal 136 is received at the analog to digital converter 26 from a source which may be a conventional pulse receiver, it is sampled by the converter 26 at a predetermined rate. If a pulse signal 138 is present within the video signal 136 as illustrated in FIG. 6A, and the pulse signal 138 has a duration of 8 samples, it has been found that transformation of the 8 sample time domain signal by the forward Walsh transformer 38 provides sufficient pulse information in approximately the lowest 32 Walsh domain sequency components. This is clearly illustrated in FIG. 6B which graphs the positive and negative normalized amplitudes of the 255 sequency components of the Walsh transform of expression (1) given above, except for the expression $a_o$ which represents the DC average component.

However, although the sequency components for the well defined high signal to noise pulse are clearly evident in FIG. 6B, the corresponding ordered sequency components for the pulse 142 of the low signal to noise signal 140 in FIG. 7B is less clearly defined. Further considering the characteristics of orthogonal or Walsh transforms, it is noted that pulses of longer duration required fewer orthogonal domain or sequency components $a_j$ to sufficiently define their configuration and location in a time interval block, while signals of shorter duration required a greater number of orthogonal domain components to sufficiently define their shorter duration and position. The signal processing means 36 operates to make a determination of whether a pulse signal is present in the time interval block being processed, and if present, the duration of the pulse signal.

If the pulse signal is of long duration, then the small number of orthogonal domain components required to define the pulse are retained, while any other components which are related to the noise present in the signal which are of higher order than the pulse related components, are eliminated. Thus for long pulses, a substantial number of the higher order orthogonal signal components are removed, thereby reducing undesired noise and more clearly defining the pulse signal present. Where an input signal of short duration is present and detected, then, of course, a larger number of orthogonal signal components are required to define its duration and position and only a smaller number of higher order components extending beyond those which are pulse related are eliminated, for improving the signal to noise ratio of the output signal.

In the example given, where 8 time domain samples define an incoming pulse signal which is hidden somewhere in the 256 sample batch, the lowest 32 Walsh domain components essentially defining the pulse are retained while in the presence of wideband noise the remaining 224 noise related components are discarded.

As a rule, information sufficiently describing the pulse duration or width W and position of pulse is approximately contained in the lowest $N_T/W$ Walsh sequency domain components, where the total Walsh components in a block is $N_T$ and the pulse width W is measured by its number of signal samples. Thus, in the case where the pulse W is 8 samples and $N_T$ is 256, most of the necessary pulse position and width information is contained in the lowest 256/8 or 32 components. It has also been mathematically found that the lowest $N_T/W$ components can, in the worst case, provide a pulse position with an error not exceeding W/2 samples. This is due to the fact that the Walsh transform is not shift invariant. Thus, a pulse of 8 samples centered at the 100th sample, has a different sequency spectrum than one of eight samples centered at the 101st sample and so forth. The information necessary to position the pulse to within W/4 samples, requires the lowest $2N_T/W$ components for the most severe case.

Thus, when a pulse of width W is present, the number of sequency domain components drastically change from the number of components required for representing broad band noise. The signal processing means 36 detects the change and distinquishes between the sequency components related to the pulse signals and those related to the noise. The processing means of the invention adaptively selects the sequency components required for providing greater position and width accuracy at high signal to noise levels while providing reliable detection with low false alarm rates and somewhat lower width and position accuracies for weaker pulses which would ordinarily be totally undetectable.

The signal analyzing means 40 of the processing means 36, operates to detect the presence of a pulse signal, determines the length or duration of the pulse signal found, and provides the information required by the component filtering means 30 for selecting the sequency components related to the pulse signal and rejecting all others as noise related. To achieve this, the analyzing means 40 receives in increasing order, the Walsh orthogonal sequency components $a_j$, except for the DC related component $a_o$. The analyzing means 40 has a number of modes x extending from 1 to X, with three modes actually being utilized for the purpose of illustration. The first mode 1 primarily determines whether a long pulse is present, whereas succeeding modes, determine the presence of shorter pulses.

In operation, the first mode processes lowest order sequency components, which for the purpose of example may be the first 6 components $a_1$ to $a_6$. The absolute values of the components are added and then divided by the number of components added, to provide the average total $\overline{N}_1$ for the first mode. At the same time, the total gate 54 passes all of 255 of the $N_T$ sequency components $a_j$ except for the DC related component $a_o$, which have their absolute values similarly added and divided by 255 to provide the average value $\overline{N}_T$ for all of these components present in the block. The ratio of $\overline{N}_1/\overline{N}_T$, provides an indication of whether a pulse of long duration is present in the block. In such a case, the ratio will exceed 1 and the preprogrammed constant $P_1$ determines the value which the ratio must exceed to indicate the presence of a pulse, while minimizing false indications. If a pulse of long duration is detected, then, threshold information and certain constants are provided to the component filtering means 30 and time thresholding means 46 for adapting them to the required filtering thresholding operations for maximizing signal to noise ratio.

However, if a long duration pulse is not found, the signal analyzing means 40 computes the ratio of a larger number of sequency components $N_2$, which for the purpose of the example is taken to be 12, to the same total average value $\overline{N}_T$. This ratio will also be over 1 to determine the presence of such a shorter duration pulse. The constant $P_2$ is chosen to have a lower value than of the constant $P_1$ for the prior mode. Such a lower vlaue is necessary, since each succeeding mode has a greater number of samples providing an average value $\overline{N}_x$, which of neccessity is closer to the average for all of the components $\overline{N}_T$. The signal analyzing means 40 proceeds from a lower mode to the next higher mode comparing the the ratio $\overline{N}_x/\overline{N}_T$ to the preprogrammed constant $P_x$ for that mode for determining the presence of a pulse and its duration. If no pulse is found, then a signal is provided over line 76 of the analyzing means 40 to the component filtering means 30. This results in the elimination of all the sequency components except for the component $a_o$ which indicates the DC level of the signal.

Although the signal analyzing means 40 as described adds the sequential components in increasing order and examines the smallest number of components of lowest order first to determine the presence of wide pulses, and after finding a wide pulse terminates its operation and does not continue to search for shorter duration pulses, the analyzing means 40 may operate otherwise. Thus, the analyzing means 40 may be programmed to look for shorter pulses first or pulses of any desired width which are to be given priority. Sequency signals from the sequency spectrum may be selected and combined in other ways for providing different modes of operation. Thus, the signal analyzing means 40 may also operate to select non-sequential components or components in certain regions of the sequency spectrum, while eliminating other regions for the purpose of its analyzing operation.

Although it has been found effective to utilize the absolute values of the sequency components in obtaining their average value, the root means square and other such functions of the signal components may also be utilized for the purpose of obtaining their totaled values and carrying out the operation of the analyzing means 40.

The information obtained by the signal analyzing means 40, is now utilized by the component filtering means 30 for selecting the sequency components which are related to detected pulses, while eliminating other undesirable sequency components which represent noise. After being delayed by the signal delay 22 (FIG. 5B) to compensate for the time taken by the signal analyzing means 40 to determine whether or not a pulse is present and the duration or width of the pulse, the serial stream of sequency components $a_j$ derived from the forward Walsh transformer 38 (FIG. 5A) is further delayed by the delay memory 98 of the component filtering means 30 to compensate for the operating time of the filtering means 30. Each sequency component is then delivered to the comparator 96. If the amplitude of the delivered signal is equal to or greater than that provided by the multiplier 100, it is passed through the delay memory 110 and the switch 104 to the line 108. This is accomplished by the delivery of a gating signal to the gate 94 which conditions the switch 104 to pass signals. If the incoming signal is below this threshold value, the comparator 96 provides a NO output signal and the AND gate 94 does not provide a gating signal to the switch 104. This prevents delivery of such low amplitude sequency signals to the sequency output line 108.

As previously noted, the threshold factor $T_{AX}$ provided to the comparator 96 is a function of the operational mode of the signal analyzing means 40 which depends upon the duration or length of a pulse signal detected in the time interval block. For longer low mode pulses, the signal $T_{AI}$ will have greater values than for the shorter signals of the higher modes. Similarly, for stronger signals, where $\bar{N}_T$ is greater, the threshold value $T_{AI}$ will also be higher than for weaker signals. The threshold signal $T_{AX}$ is multiplied by the constant $C_{CX}$, which constant is also a function of the operational mode X and adjusts for the desired sensitivity to false alarm tradeoff. The comparator 96, thus acts, to adaptively eliminate certain sequency components falling below the operationally determined threshold.

In addition to eliminating such below threshold sequency component coefficients from the serial stream, the component filtering means 30 by its comparator 86, counter 88, and comparator 90 operates to eliminate all sequency components after the occurrence of a certain condition.

The condition occurs when the average value $\bar{a}_{jx}$ of a number $M_X$ of sequentially ordered components is below the value of $T_{AX}$. Both $M_X$ and $N_X$ and $N_X$ are functions of the operational mode determined by the signal analyzing means 40. If $M_X$ is 6 and the average value $\bar{a}_{jx}$ of 6 sequential components is below the value $T_{AX}$, a NO output signal is provided to the counter 88 which increases its count. If counter 88 reaches the count $K_X$, the comparator 90 switches the flip flop 92 to its SET condition delivering an inhibiting signal to the gate 94. This prevents delivery of gating signals over line 102 to the switch 104 for the remainder of the time interval block. A YES output signal is delivered to the counter 88 resetting the counter to 0 and requiring the counter to start counting over again whenever the output of the divider 84 exceeds the threshold $T_{AX}$.

This arrangement, provides for the situation where certain sequency components are missing or are of low amplitude, while others of strong amplitude are still present. The sliding integration of sequency components for discontinuous spectra is important, since the Walsh transform output is not shift invariant, and such integration provides for the condition that can occur for certain combinations of pulse width and position, where the signal is distributed in the sequency domain with discontinuous low amplitude components followed by higher amplitude components. The sliding integrator allows delivery of such higher amplitude components until the following conditions are met. Since the components associated with a detectable signal pulse have an amplitude greater than the components associated with the noise signals, this circuit in effect operates to determine whether strong signals related to the signal pulse have already been passed by the switch 104, so that the remaining signals are related to the noise. When the average of a number $M_X$ of the consecutive sequency components falls below the value $T_{AX}$ for $K_X$ consecutive times, the determination is made that the sequency components related to pulse signals are no longer present, and the switch 104 is inhibited at the time to eliminate all subsequent components during the time interval block. Of course, when no signal has been detected by the signal analyzing means 40, the switch 104 is inhibited by the signal on line 76 so that no signal components are passed for the block except for the initial DC component $a_o$ which is gated through the switch 104 by enabling signal $E_{a_o}$.

Referring the FIG. 6B illustrating the sequency components of the signal 136 of FIG. 6A, it is seen that after a number of high amplitude low order sequency signals, the higher order signals are of low amplitude and distributed to the end of the sequency block. This signifies the presence of a pulse with a high signal to noise ratio. FIG. 6C illustrates the operation of the component filtering means 30, which retains only the low ordered high amplitude signal components, and eliminates the noise associated high ordered low amplitude signal components.

The adaptively filtered sequency components are delivered through switch 104 over the line 108 to the inverse Walsh transformer 44 which may be in the nature of a fast Walsh transform device, known in the art. The output signals from the inverse Walsh transformer 44 are in the time domain and provided the filtered output signal 138' shown in FIG. 6D, which has the form and position within the time interval block corresponding to the pulse 138 of FIG. 6A.

In considering the FIGS. 7B and 7C, when a signal 140 with a low signal to noise ratio is received by the device 36 having the pulse signal 142 shown in FIG. 7A, the ordered sequency components 148 provided by the forward Walsh transformer 38 (FIG. 5A) vary in amplitude from sequency component to sequency component, and on the average decrease in amplitude for the higher ordered sequencies. In this situation, the signal analyzing means 40, also operates to determine the presence of a pulse signal and to select an operational mode determined by the pulse duration or width. This information which is provided to the component filtering means 30 results in passing only the signal sequency components 150 through the switch 104 to the line 108, while eliminating high sequency components of high order determined to be noise related as illustrated in FIG. 7C. The sequency components 150 are transformed to time domain elements $b_3$ of the output signal 140' by the inverse Walsh transformer 44 which are delivered on line 45. The output signal 140' on line 45 as represented in FIG. 7D shows that the high frequency components have been eliminated and the pulse signal 142' is more clearly defined and of greater relative amplitude than the surrounding noise.

The output signals 136' and 140' illustrated in FIGS. 6D and 7D correspond to the input signals 136 and 140 of FIGS. 6A and 7A respectively with high and low signal to noise ratios. The signals 136' and 140' are reconstructed by the time thresholding means 46 to provide respective output signals 144 and 146 in digital form on line 131 and in analog form on output line 50 as illustration in FIGS. 6E and 7E.

In performing the reconstructing operation, the time thresholding means 46 derives a thresholding constant $C_{BX}$ from the signal analyzing means 40 which constant is determined by the operational mode energized by the incoming signal. This constant can vary from 0.1 to 0.99 and is set low for longer pulses to increase pulse width accuracy and higher for shorter pulses to avoid false indications. The time thresholding means 46 by use of the constant $C_{BX}$ illiminates all signal amplitudes having a value below the value of the threshold TH'. The threshold TH' is determined by the peak amplitude value of the signal elements $b_e$ received by the thresholding means 46, to which value the DC component, provided by the sequency component $a_o$, is added. When all incoming element $b_e$ are compared in the comparator 126 to the threshold TH', an output signal equal to the peak value PV less the DC value (PV − DC) is delivered to line 131, while a zero amplitude signal is delivered for any signal element having a value below the threshold TH'. This provides the reconstructed output signals 144 and 146 of FIGS. 6E and 7E in which all signals below the threshold amplitude have a zero value and the pulses are of rectangular form.

As stated previously, the memory 120 can provide the peak value PV, while the base readout 130 provides the DC average level, when respective YES and NO outputs are delivered by the comparator 126. This will result in the delivery to the line 131 of an output signal having the DC average level of the input video signal and a pulse peak value PV, for representing the signal as actually received at the input 12. The rectangular pulse signals are provided within their time blocks to accurately represent their time of arrival and duration. Such signals may be used for gating purposes or other such functions where this information is required. Of course, the signals delivered at the output lines 18, 45, and 50 are delayed with respect to the incoming signals but are presented in the same sequence and with the same time intervals between them as the received signals.

The FIGS. 8A, 8B, 8C, and 8D relate to the operation of the signal processing means 24 of FIG. 3 when the orthogonal transformers 28, and 32 of the means 24 are respectively forward and inverse Fourier transformers, and to the signal processing means 36 of FIG. 4 when the Walsh transformers 38, and 44 are replaced by corresponding Fourier transformers. As in the case of the Walsh transform the initial component of the Fourier transform comprises a coefficient representing the DC average value of the signal, and the subsequently ordered coefficients $a_j$ are frequency ordered Sin and Cos components.

With the receipt by the means 24 of a rectangular pulse 151 as illustrated in FIG. 8A, the Fourier transformer of the forward orthogonal transformer 28 delivers the output frequency signal components 152 illustrated in rectified form in FIG. 8B. The plurality of the frequency components 158 are arranged in order of increasing frequency to provide positive amplitudes which vary depending upon the pulse duration or width and occurrence within the time interval block. The operation of the signal analyzing means 40 and component filtering means 30 on the frequency components 152, results in elimination of the higher order frequency components of lower amplitude, leaving only the frequency components of higher amplitude 152' illustrated in FIG. 8C.

The transformation of the lower frequency components 152' by the inverse transformer 32 results in an output pulse 154 in the time domain, as illustrated in FIG. 8D. In comparing the original pulse 150, with the output pulse 154 delivered on line 18, it is noted that the pulse 154 has been changed in configuration to have sloped forward and trailing edges. From this, it is apparent that the Walsh transform is more suitable for use in connection with rectangular pulses, whereas the Fourier transform and other transforms may be suitable for treating pulses of non-rectangular form.

Thus, the particular orthogonal transformation which is selected for use in the invention depends upon the results which are desired. If an output signal with sloped sides is desired, then a transform other than the Walsh transform would be utilized, whereas if output signals of rectangular configuration are sought, then the Walsh transform would be used. In other cases, where other results are sought, appropriate orthogonal transformations or series of same may be employed. The text by H. F. Harmuth entitled "Transmission of Information By Orthogonal Functions" referred to above, describes Walsh and Fourier transformations, as well as simple non-adaptive filters utilizing such transformations. A Walsh transformer of the fast Walsh type may effectively be utilized for the disclosed Walsh transformers 38 and 44. The article by Lloyd W. Martinson and Richard J. Smith entitled "Digital Matched Filtering With Pipelined Floating Point Fast Fourier Transforms," IEEE Transactions on Acoustics, Speech, and Signal Processing, Volume ASSP-23, No. 2, April 1975, pages 222 to 233, and the article by Herbert L. Groginsky and George A. Works entitled "A Pipeline Fast Fourier Transform," IEEE, Transactions on Computers, C-19, November, 1970, pages 354 to 358, relate to fast Fourier transformation apparatus. The U.S. Pat. No. 3,553,723 of F. R. Ohnsorg, and U.S. Pat. Nos. 3,668,639 and 3,705,981 of H. Harmuth also relate to the utilization of Walsh transforms for filtering and other purposes.

The signal processing means and method of the invention have many advantages which include improving signal to noise ratio, generally by 10 db and by as much as 20 db, and improving pulse width and position or time of arrival measurement accuracies for signals with low signal to noise ratios. The processing device and method also provides improved amplitude measurement accuracy for low signal to noise ratio pulses. Signals which are of a non pulse character, such as DC input signals, are detected but have no effect in the determination of the presence of pulse signals. Although the operation of the processing method is independent of the DC input level, the DC level information is retained for providing this information in the output signal. The processing device and method is also highly effective for removing noise and distortion from detected pulse signals, especially those of rectangular shape.

Although the processing steps of the device have been described in detail for a serial stream of orthogonal components which are in digital form, the invention may also be carried out by using analog devices and/or digital or analog information in parallel presentation, as distinquished from the serial form described.

Although the signal processing means and method have been described in several forms and modes of operation, it will be obvious to those skilled in the art that the invention may find wide application with appropriate modification to meet the individual design requirements and circumstances, but without substantially departing from the essence of the invention.

What is claimed is:

1. A signal processing means for pulse signals which are received with noise signals comprising terminal means for receiving input signals including pulse and noise signals with the pulse signals occurring at unknown times and having unknown durations; signal filtering means having a first input receiving signals derived from said terminal means, a second input and an output; said signal filtering means having a controllable filter characteristic for passing signals from its first input to its output responsive to signals received at its second input; and a signal analyzing means having an input receiving signals derived from said terminal means and an output delivering signals which are responsive to signals currently received at its input without using previous signals, to the second input of said signal filtering means for controlling its filter characteristic; whereby the output of said signal filtering means delivers signals corresponding to the pulse signals of the input signals of said terminal means while minimizing the delivery of noise signals received at said terminal means.

2. The means of claim 1 in which the output signals of said analyzing means are a function of the durations of the pulse signals received by said terminal means; and the filter characteristic of said filtering means is controlled by the output signals of said signal analyzing means for passing said pulse signals and minimizing the delivery of noise signals received at said terminal means.

3. The means of claim 2 in which the filter characteristic of said filtering means is controlled by the output signals of said signal analyzing means for passing said pulse signals received at said terminal means while minimizing the delivery of noise signals having durations shorter than said pulse signal durations.

4. The means of claim 1 including signal delay means receiving signals from said terminal means and delivering such signals after a predetermined time delay to the first input of said signal filtering means.

5. The means of claim 1 in which said signal analyzing means includes signal transforming means receiving input signals and providing output signals which correspond to an orthogonal transformation of the input signals.

6. The means of claim 1 in which said signal filtering means includes signal transforming means receiving input signals and providing output signals which corresponds to an orthogonal transformation of the input signal.

7. The means of claim 6 in which said signal analyzing means includes signal transforming means receiving input signals and providing output signals which correspond to an orthogonal transformation of the input signals.

8. The means of claim 7 in which the orthogonal transformation of said signal transforming means includes a Walsh function transforming means.

9. The means of claim 7 in which the orthogonal transformation of said signal transforming means includes a Fourier function transforming means.

10. The means of claim 6 in which the output of said signal analyzing means provides an output signal having a value determined by the length of the pulse signals received at the terminal means, and the output of said signal filtering means delivers those output signals of its signal transforming means which have a value not less than a threshold value which is a function of the value of the output signal of the signal analyzing means.

11. The means of claim 1 including first signal transforming means receiving input signals from said terminal means and delivering output signals corresponding to an orthogonal transformation of its input signals; and in which the first input of said signal filtering means receives the output signals from said signal transforming means for providing its output signals.

12. The means of claim 11 in which the input of said signal analyzing means receives output signals from said first signal transforming means for providing an output signal to said signal filtering means.

13. The means of claim 12 in which the first signal transforming means receives signals in the time domain and transforms same into signals in the orthogonal domain; and includes a second signal transforming means which receives the output signals of said signal filtering means in the orthogonal domain and delivers output signals in the time domain.

14. The means of claim 13 in which the orthogonal transformation of said signal transforming means includes a Walsh function transforming means.

15. The means of claim 13 in which the orthogonal transformation of said signal transforming means includes a Fourier function transforming means.

16. The means of claim 13 in which said signal analyzing means provides an output signal having a value related to the length of pulse signals received at said terminal means and determined by the values of the output signals of said first signal transforming means, and the output of said signal filtering means delivers those output signals of said first signal transforming means except for those which have a value less than a corresponding value of the output signal of the signal analyzing means.

17. The means of claim 12 in which said signal analyzing means provides an output signal having a value related to the length of pulse signals received at said terminal means and determined by the values of the output signals of said signal transforming means, and the output of said signal filtering means delivers output signals of the signal transforming means except for those which have a value less than a corresponding value of the output signal of the signal analyzing means.

18. The means of claim 11 in which the first signal transforming means receives signals in the time domain and transforms same into signals in the orthogonal domain; and includes a second signal transforming means receiving the output signal of said signal filtering means in the orthogonal domain and delivers output signals in the time domain.

19. The means of claim 1 including signal transforming means receiving input signals from said terminal means and delivering output signals corresponding to an orthogonal transformation of its input signals; and in which the input of said signal analyzing means receives the output signals from said signal transforming means for providing its output signals to said signal filtering means.

20. The means of claim 1 including a first signal transforming means receiving signals in the time domain from said signal terminal means and delivering output signals in the orthogonal domain corresponding to an orthogonal transform function of its input signals; and signal delay means receiving the output signals from said first signal transforming means and delivering such signals after a predetermined time delay to the first input of said signal filtering means.

21. The means of claim 20 in which the input of said signal analyzing means receives output signals from said first signal transforming means for providing an output signal to said signal filtering means.

22. The means of claim 21 including a second signal transforming means receiving the output signals of said signal filtering means in the orthogonal domain and delivering transformed output signals in the time domain corresponding to said signals in the orthogonal domain.

23. The means of claim 22 in which the orthogonal transformations of said first and second signal transforming means includes respectively Walsh and inverse Walsh transformations.

24. The means of claim 22 in which the orthogonal transformations of said first and second signal transforming means includes respectively Fourier and inverse Fourier transformations.

25. The means of claim 20 including a second signal transforming means receiving the output signals of said signal filtering means in the orthogonal domain and delivering transformed output signals in the time domain corresponding to said signals in the orthogonal domain.

26. The means of claim 1 including a first signal transforming receiving input signals in the time domain from said signal terminal means and delivering output signals in the orthogonal domain corresponding to an orthogonal transformation of its input signals; and in which the input of said signal analyzing means receives the output signals from said signal transforming means for providing its output signals to said signal filtering means; and signal delay means receiving the output signals from said first signal transforming means and delivering such signals after a predetermined delay to the first input of said signal filtering means.

27. A signal processing means for pulse signals which are received with noise signals comprising terminal means for receiving input signals including pulse and noise signals with the pulse signals occurring at unknown times and having unknown durations; signal filtering means having a first input receiving signals derived from said terminal means, a second input and an output; said signal filtering means having a controllable filter characteristic for passing signals from its first input to it output responsive to signals received at its second input; a signal analyzing means having an input receiving signals derived from said terminal means and an output delivering signals which are responsive to signals received at its input, to the second input of said signal filtering means for controlling its filter characteristic; and a signal thresholding means having a first input receiving the output signals of said signal filtering means, a second input receiving signals from the output of said signal analyzing means for controlling the operation of the signal thresholding means, and an output delivering signals corresponding to the pulse signals in the input signals of the terminal means while minimizing signals below a threshold value determined by said signal analyzing means.

28. The means of claim 27 including first signal transforming means receiving input signals in the time domain from said terminal means and delivering output signals in the orthogonal domain corresponding to an orthogonal transformation of its input signals; the first input of said signal filtering means receiving the output signals from said first signal transforming means for providing its output signals; and a second signal transforming means receiving the output signals of said signal filtering means in the orthogonal domain and delivering to the first input of said signal thresholding means signals in the time domain corresponding to an inverse orthogonal transformation of the output signals from said signal filtering means.

29. The means of claim 28 in which said signal analyzing means provides first and second output signals having values related to the length of pulse signals received at said terminal means and determined by the values of the output signals of said first signal transforming means, the first output signals of said signal analyzing means being delivered to the second input of said signal filtering means while said second output signal is delivered to the second input of said signal thresholding means, and the output of said signal filtering means delivers those output signals of said first signal transforming means except for those which have a value less than a corresponding value of the first output signal of said analyzing means.

30. The means of claim 29 in which the output signals of said first signal transforming means are orthogonal signal components of various orders each having a respective value, and the output of said signal filtering means delivers such orthogonal signal components except for those of non-zero order which have values less than the corresponding value of the first output signal of said analyzing means.

31. The means of claim 30 in which said signal filtering means delivers said orthogonal signal components in increasing order until a predetermined successive number of said components provide values which are less than a threshold value related to the value of the output signal of said signal analyzing means, after which said signal filtering means terminates delivery of any higher order of components, whereby the signal filtering means selectively delivers orthogonal signal components of lower order more closely associated with pulse signals in the input signals while discriminating against high order components associated with noise signals.

32. The means of claim 31 in which said signal filtering means includes means averaging the values of a predetermined successive number of said non-zero orthogonal signal components and delivers an averaged value with the occurrence of each successive signal component, said signal filtering means delivering said orthogonal signal components in increasing order until a predetermined number of said averaged values of said orthogonal signal components are less than said threshold value, after which said signal filtering means terminates delivery of any higher order of components, said threshold value being a direct function of the total of the values of all non-zero orders of said orthogonal signal components derived from the output of said first signal transforming means.

33. The means of claim 30 in which said signal thresholding means receives from the output of said second signal transforming means a group of time domain output signals corresponding to the orthogonal signal components delivered to the second signal transforming means by said signal filtering means, said thresholding means delivering a time domain signal for each of the signals received from said second signal transforming means which is not less than a threshold value related to the second output signal from said signal analyzing means.

34. The means of claim 33 in which said signal thresholding means includes a peak detecting means receiving the time comain output signals of said second signal transforming means and determining the peak value for said group of time domain signals, and computing means receiving the detected peak value of said peak detecting means and the second output signal of said signal analyzing means for providing said threshold value of said signal thresholding means.

35. The means of claim 34 which said signal thresholding means includes signal comparing means receiving the time domain output signals of said second signal transforming means after a predetermined delay and said threshold value from said computing means, and delivering an output signal for each of said time domain signals except for such signals which have a value less than the value of said threshold signal.

36. The means of claim 35 in which said signal thresholding means includes signal storing means deriving from said first signal transforming means the zero-order orthogonal signal component having a value representing the DC value of the input signal received by the terminal means and delivering same to said comparing means, said comparing means delivering an output signal corresponding to said DC value in place of each time domain signal which it receives which has a value less than the value of said threshold signal.

37. The means of claim 36 in which the output signals delivered by said signal comparing means for each of said time domain signals having a value which is not less than the value of said threshold value have the detected peak value of said peak detecting means.

38. The means of claim 35 in which said signal thresholding means includes signal storing means deriving from said first signal transforming means the zero-order orthogonal signal component having a value representing the DC value of the input signal received by the terminal means and delivering same to said computing means, said computing means subtracts said DC value from said detected peak value and delivers an output signal representing the difference value to said signal comparing means, said computing means multiplies said difference value by the value of the second output signal from said signal analyzing means and adds the DC value to the product and delivers the value of the sum to said comparing means as said threshold value of said thresholding means, and said signal comparing means for each of said time domain signals which it receives having a value which is not less than said threshold value delivers an output signal having a value of the difference of said detected peak value and said DC value, and in place of each time domain signal which it receives which has a value less than the value of said threshold signal delivers an output signal having a zero value.

39. The means of claim 27 including delay means deriving signals from said terminal means and delivering such signals after a predetermined delay to the first input of said signal filtering means.

40. The means of claim 39 including first signal transforming means receiving input signals in the time domain from said terminal means and delivering output signals in the orthogonal domain corresponding to an orthogonal transformation of its input signals through said delay means to the first input of said signal filtering means, and a second signal transforming means receiving the output signals of said signal filtering means in the orthogonal domain and delivering to the first input of said signal thresholding means signals in the time domain corresponding to an inverse orthogonal transformation of the output signals from said signal filtering means.

41. A signal processing means for pulse signals which are received with noise signals comprising terminal means for receiving input signals including pulse and noise signal with the pulse signals occurring at unknown times and having unknown durations; signal filtering means having a first input receiving signals derived from said terminal means, a second input and an output; said signal filtering means having a controllable filter characteristic for passing signals from its first input to its output responsive to signals received at its second input; a signal analyzing means having an input receiving signal derived from said terminal means and an output delivering signals which are responsive to signals received at its input, to the second input of said signal filtering means for controlling its filter characteristic; and first signal transforming means receiving input signals from said terminal means and delivering output signals corresponding to an orthogonal transformation of its input signals; the first input of said signal filtering means receiving the output signals from said signal transforming means for providing its output signals, and the input of said signal analyzing means receiving output signals from said first signal transforming means for providing an output signal to said signal filtering means; said signal analyzing means providing an output signal having a value related to the length of pulse signals received at said terminal means and determined by the values of the output signals of said signal transforming means, and the output of said signal filtering means delivering the output signals of the signal transforming means except for those which have a value less than a corresponding value of the output signal of the signal analyzing means; the output signals of said signal transforming means being orthogonal signal components of various orders each having a respective value, and the output of said signal filtering means delivering such orthogonal signal components except for those of non-zero order which have values less than the corresponding value of the output signal of said signal analyzing means.

42. The means of claim 41 in which said signal filtering means delivers the orthogonal signal components of the signal transforming means in increasing order until a predetermined successive number of said components provide values which are less than a threshold value which is related to the value of the output signal of said signal analyzing means, after which said signal filtering means terminates delivery of any higher order of components, whereby the signal filtering means selectively delivers orthogonal signal components of lower order more closely associated with pulse signals in the input signals while discriminating against high order components associated with noise signals.

43. The means of claim 41 in which said signal analyzing means determines the value of its output signal by comparing the total of the values of selected non-zero orders of said orthogonal signal components to the total of the values of all non-zero orders of said orthogonal signal components derived from the output of said signal transforming means.

44. The means of claim 41 in which said signal analyzing means determines the value of its output signal by comparing the total of the values of a predetermined number of said orthogonal signal components of non-zero low order to the total of the values of all non-zero orders of said orthogonal signal components derived from the output of said signal transforming means.

45. The means of claim 41 in which said signal analyzing means determines the value of its output signal by obtaining the value of the ratio of the total of the values of selected non-zero orders of said orthogonal signal components to the total of the values of all non-zero orders of said orthogonal signal components derived from the output of said signal transforming means, and comparing the value of said ratio to a predetermined value for determining the length of the pulse signal at said terminal means.

46. The means of claim 45 in which a plurality of values of said ratio are obtained by said signal analyzing means for a respective plurality of groups of selected non-zero orders of said orthogonal signal components, and are respectively compared to a plurality of predetermined values for determining the length of the pulse signal at said terminal means.

47. The means of claim 46 in which the respective plurality of groups of selected non-zero orders of said orthogonal signal components include a group of selected ones of said orthogonal signal components of low order and groups of selected ones of said orthogonal signal components which include successively increasing orders for providing said respective plurality of values of said ratio for comparison to said plurality of predetermined values for determining the length of the pulse signal at said terminal means.

48. The means of claim 47 in which the values of said ratio are respectively compared with their said plurality of respective predetermined values in sequence with the orders of the orthogonal signal components of said plurality of groups of selected orders increasing to represent decreasing pulse length, and the output signal of said analyzing means related to the length of the pulse signal at said terminal means is determined by the first sequential occurrence of a value of one of said plurality of values of said ratio which is not less than the value of its repective predetermined value to which it is compared.

49. The means of claim 48 in which the said signal analyzing means delivers an output signal indicating that a pulse signal has not been detected in the input signal received by said terminal means when each of the plurality of values of said ratio is less than its respective predetermined value to which it is compared.

50. The means of claim 48 in which the values of said plurality of respective predetermined values with which the values of said ratio are compared decrease in sequence to correspond with the representation of decreasing pulse length by said plurality of groups of selected orders.

51. The means of claim 48 in which the output signal of said analyzing means has a respective value for each pulse length which it determines, with the value of said output signal decreasing with the decrease in the pulse length determined by said signal analyzing means.

52. The means of claim 48 in which the output signal of said signal analyzing means has a value which is a direct function of the total of the values of the non-zero orders of said orthogonal signal components derived from the output of said signal transforming means.

53. The means of claim 52 in which the output signal of said signal analyzing means has a respective value for each pulse length which it determines, with the value of the output signal decreasing with the decrease in the pulse length determined by said signal analyzing means.

54. The means of claim 47 in which the values of said ratio are respectively compared with their said plurality of respective predetermined values, with the orders of the orthogonal signal components of said plurality of groups of said selected orders increasing to represent decreasing pulse length, and the output signal of said analyzing means related to the length of the pulse signal at said terminal means is determined by the occurrence of a value of said plurality of values of said ratio which is not less than the value of its respective predetermined value to which it is compared.

55. A signal processing means for pulse signals which are received with noise signals comprising terminal means for receiving input signals including pulse and noise signals with the pulse signals occurring at unknown times and having unknown durations; signal filtering means having a first input receiving signals derived from said terminal means, a second input and an output; said signal filtering means having a controllable filter characteristic for passing signals from its first input to its output responsive to signals received at its second input; a signal analyzing means having an input receiving signals derived from said terminal means and an output delivering signals which are responsive to signals received at its input, to the second input of said signal filtering means for controlling its filter characteristic; first signal transforming means receiving input signals from said terminal means and delivering output signals corresponding to an orthogonal transformation of its input signals; the first input of said signal filtering means receiving the output signals from said signal transforming means for providing its output signals, and the input of said signal analyzing means receiving output signals from said first signal transforming means for providing an output signal to said signal filtering means; the first signal transforming means receiving signals in the time domain and transforming same into signals in the orthogonal domain; and second signal transforming means receiving the output signals of said signal filtering means in the orthogonal domain and delivering output signals in the time domain; said signal analyzing means providing an output signal having a value related to the length of pulse signals received at said terminal means and determined by the values of the output signals of said first signal transforming means; the output of said signal filtering means delivering output signals of said first signal transforming means except for those which have a value less than a corresponding value of the output signal of the signal analyzing means; the output signals of said first signal transforming means being orthogonal signal components of various orders each having a respective value, and the output of said signal filtering means delivers such orthogonal signal components except for those of non-zero order which have values less than the corresponding value of the output signal of said signal analyzing means.

56. The means of claim 55 in which said signal filtering means delivers said orthogonal signal components in increasing order until a predetermined successive number of said components provide values which are less than a threshold value which is related to the value of the output signal of said signal analyzing means, after which said signal filtering means terminates delivery of any higher order of components, whereby the signal filtering means selectively delivers orthogonal signal components of lower order more closely associated with pulse signals in the input signals while discriminating against high order components associated with noise signals.

57. The means of claim 56 in which said signal filtering means includes means averaging the values of a predetermined successive number of said non-zero orthogonal signal components and delivering an averaged value with the occurrence of each successive signal component, said signal filtering means delivering said orthogonal signal components in increasing order until a predetermined successive number of said averaged values of said orthogonal signal components are less than said threshold value, after which said signal filtering means terminates delivery of any higher order of components, said threshold value being a direct function of the total of the values of all non-zero orders of said orthogonal signal components derived from the output of said first signal transforming means.

58. A signal processing method including the steps of
a. receiving an input signal including pulse and noise signals with the pulse signals occurring at unknown times and having unknown durations,
b. analyzing the input signal for determining the presence of a pulse signal and its duration without using previously derived signals and providing a control signal responsive thereto, and
c. filtering the input signal with a filtering means having a controllable transfer characteristic responsive to said control signal and delivering a filtered output signal, whereby the filtered output signal provides pulse signals of the input signal while minimizing the noise signals.

59. The method of claim 58 in which said control signal is a function of the duration of the pulse signals of said input signal for controlling the transfer characteristic.

60. The method of claim 58 including the step of (d) transforming said input signal of step (a) by an orthogonal transformation and subjecting said transformed input signal to said analyzing step (b).

61. The method of claim 60 in which the orthogonal transformation includes a Walsh function.

62. The method of claim 58 including the step of (d) transforming said input signal of step (a) by an orthogonal transformation and subjecting said transformed input signal to the filtering of step (c).

63. The method of claim 61 in which the orthogonal transformation includes a Walsh function.

64. The method of claim 58 including the step of transforming said input signal of step (a) by an orthogonal transformation and subjecting said transformed input signal to said analyzing step (b) and said filtering step (c).

65. The method of claim 64 in which the orthogonal transformation includes a Walsh function.

66. The method of claim 64 in which the orthogonal transformation includes a Fourier function.

67. A signal processing method including the steps of
a. receiving an input signal in the time domain including pulse and noise signals with the pulse signals occurring at unknown times and having unknown durations,
b. transforming the input signals of step (a) by an orthogonal transformation into the orthogonal domain,
c. analyzing the transformed input signal in the orthogonal domain for determining the presence of a pulse signal and its duration and providing a control signal responsive thereto, and
d. filtering the input signal with a filtering means having a controllable transfer characteristic responsive to said control signal and delivering a filtered output signal, whereby the filtered output signal provides pulse signals of the input signal while minimizing the noise signals.

68. The method of claim 67 in which the orthogonal transformation includes a Walsh function.

69. The method of claim 67 in which the orthogonal transformation includes a Fourier function.

70. A signal processing method including the steps of
a. receiving an input signal in the time domain including pulse and noise signals with the pulse signals occurring at unknown times and having unknown durations,
b. transforming the input signals of step (a) by an orthogonal transformation into the orthogonal domain,
c. analyzing the input signal for determining the presence of a pulse signal and its duration and providing a control signal responsive thereto, and
d. filtering the transformed input signal in the orthogonal domain with filtering means having a controllable transfer characteristic responsive to said control signal and delivering a filtered output signal, whereby the filtered output signal provides pulse signals of the input signal while minimizing the noise signals.

71. The method of claim 70 including the step of e. transforming the filtered output signal of step (d) by an inverse orthogonal transformation into the time domain.

72. The method of claim 71 in which the transformed input signal of step (b) in the orthogonal domain in analyzed in step (c) for determining the presence of a pulse signal and its duration and for providing said control signal.

73. The method of claim 72 in which the orthogonal transformation of step (b) is a Walsh transformation, and the orthogonal transformation of step (e) is an inverse Walsh transformation.

74. The method of claim 72 in which the orthogonal transformation of step (b) is a Fourier transformation, and the orthogonal transformation of step (e) is an inverse Fourier transformation.

75. A signal processing method including the steps of
   a. receiving an input signal including pulse and noise signals with the pulse signals occurring at unknown times and having unknown durations,
   b. analyzing the input signal for determining the presence of a pulse signal and its duration and providing a control signal responsive thereto,
   c. filtering the input signal with a filtering means having a controllable transfer characteristic responsive to said control signal and delivering a filtered output signal which provides pulse signals of the input signal while minimizing the noise signals, and
   d. applying the filtered output signals of step (c) to a thresholding means responsive to the control signal provided in step (b) for delivering output pulse signals with controlled amplitudes.

76. A signal processing method including the steps of
   a. receiving an input signal in the time domain including pulse and noise signals with the pulse signals occurring at unknown times and having unknown durations,
   b. transforming the input signals of step (a) by an orthogonal transformation into the orthogonal domain,
   c. analyzing the input signal for determining the presence of a pulse signal and its duration and providing a control signal responsive thereto,
   d. filtering the transformed input signal in the orthogonal domain with filtering means having a controllable transfer characteristic responsive to said control signal and delivering a filtered output signal which provides pulse signals of the input signal while minimizing the noise signals,
   e. transforming the filtered output signal of step (d) by an inverse orthogonal transformation into the time domain, and
   f. applying the filtered output signal in the time domain of step (e) to a thresholding means responsive to the control signal provided in step (c) for delivering output pulse signals with controlled amplitudes.

77. The method of claim 76 in which the analyzing step (c) provides first and second control signals having values determined by the lengths of pulse signals received in step (a) and determined by the values of the transformed input signals of step (b), said transforming step (e) provides a plurality of signal components corresponding to the input signal of step (a), the filtering step (d) provides a filtered output signal of the orthogonal signal components of step (b) which have a value not less than a first threshold value which is a function of the value of the first control signal of step (c), and the thresholding means of step (f) is responsive to the second control signal of the analyzing step (c) for delivering output signals with controlled amplitudes.

78. The method of claim 77 in which said transforming step (b) provides a plurality of orthogonal signal components of various orders each having a respective value for corresponding with the input signal of step (a), and the filtering step (d) provides a filtered output signal of the orthogonal signal components except or those of non-zero order which have values not less than said first threshold value which is a function of the value of the control signal of step (c).

79. The method of claim 78 in which in the filtering step (d) the orthogonal signal components of the filtered output signal are provided in increasing order until a predetermined successive number of said components provide values which are less than said first threshold value related to the value of the control signal of the analyzing step (c), after which the filtered output signal does not include any higher order of components, whereby the filtering step (d) selectively delivers orthogonal signal components of lower order more closely associated with pulse signals in the input signal of step (a) while discriminating against high order components associated with noise signals.

80. The metho of claim 79 in which the filtering step (d) includes averaging the values of a predetermined successive number of said non-zero orthogonal signal components of the transformed signal of transforming step (b) and providing an averaged value with the occurrence of each successive signal component, the filtering step (d) delivering the orthogonal signal components of said transformed signal of step (f) in increasing order until a predetermined successive number of said averaged values are less than said first threshold value, after which the filtered output signal does not include any higher order of components, said first threshold value being a direct function of the total of the values of all non-zero orders of said orthogonal signal components of the transformed signal of the transforming step (b).

81. The method of claim 78 in which the transformed output signal of step (e) is a group of time domain output signals corresponding to the filtered output signal of step (d), and the thresholding means of step (f) receives the group of time domain signals of step (e) and delivers a time domain signal for each of the signals received which is not less than a second threshold value related to said second control signal of the analyzing step (c).

82. The method of claim 81 in which the thresholding means of step (f) determines the peak value of said group of time domain signals and provides said second threshold value using said peak value and said second control signal of said analyzing step (c).

83. The method of claim 82 in which the thresholding means of step (f) receives the time domain signals of said group of time domain signals of step (e) and delivers an output signal for each of said time domain signals except for such signals which have a value less than the value of said second threshold value.

84. The method of claim 83 in which the thresholding means of step (f) receives the zero-order orthogonal component derived from the transforming step (b) having a value representing the DC value of the input signal of step (a) and delivers it in place of each time domain signal of said group of time domain signals of step (e) which has a value less said second threshold value.

85. The method of claim 84 in which the signal delivered by the thresholding means of step (f) for each time domain signal having a value which is not less than the value of said second threshold value is said detected peak value.

86. The method of claim 83 in which the thresholding means of step (f) receives the zero-order orthogonal component derived from the transforming step (b) having a value representing the DC value of the input signal of step (a), subtracts said DC value from the detected peak value of said group of time domain signals to provide a difference value, multiplies the difference value by the value of the second control signal of said analyzing step (c) to provide a product value, and adds to the product value the DC value to provide said second threshold value, and said thresholding means delivers for each of the time domain signals of said group of time domain signals of step (e) which it receives having a value which is not less than said second threshold value an output signal having said difference value, and in place of each time domain signal which it receives which has a value less than the value of said second threshold value delivers an output signal having a zero value.

87. A signal processing method including the steps of
a. receiving an input signal including pulse and noise signals with the pulse signals occuring at unknown times and having unknown durations,
b. analyzing the input signal for determining the presence of a pulse signal and its duration and providing a control signal responsive thereto,
c. filtering the input signal with a filtering means having a controllable transfer characteristic responsive to said control signal and delivering a filtered output signal which provides pulse signals of the input signal while minimizing the noise signals, and
d. transforming said input signal of step (a) by an orthogonal transformation and subjecting said transformed input signal to the filtering of step (c),
the analyzing step (b) providing control signals having values determined by the lengths of the pulse signals received in step (a), said transforming step (d) providing a plurality of orthogonal signal components corresponding to the input signal of step (a), and the filtering step (c) providing a filtered output signal of the orthogonal signal components of step (d) which have a value not less than a threshold value which is a function of the value of the control signal of step (b).

88. A signal processing method including the steps of
a. receiving an input signal in the time domain including pulse and noise signals with the pulse signals occurring at unknown times and having unknown durations,
b. transforming the input signals of step (a) by an orthogonal transformation into the orthogonal domain,
c. analyzing the input signal for determining the presence of a pulse signal and its duration and providing a control signal responsive thereto,
d. filtering the transformed input signal in the orthogonal domain with filtering means having a controllable transfer characteristic responsive to said control signal and delivering a filtered output signal which provides pulse signals of the input signal while minimizing the noise signals, and
e. transforming the filtered output signal of step (d) by an inverse orthogonal transformation into the time domain, the transformed input signal of step (b) in the orthogonal domain being analyzed in step (c) for determining the presence of a pulse signal and its duration and for providing said control signal, the analyzing signal (c) providing control signals having values related to the lengths of pulse signals received in step (a) and determined by the values of the transformed input signals of step (b), said transforming step (b) providing a plurality of orthogonal signal components corresponding to the input signal, of step (a), and the filtering step (d) providing a filtered output signal of the orthogonal signal components of step (b) which have values not less than a threshold value which is a function of the value of the control signal of step (c).

89. The method of claim 88 in which said transforming step (b) provides a plurality of orthogonal signal components of various orders each having a respective value for corresponding with the input signal of step (a), and the filtering step (d) provides a filtered output signal of the orthogonal signal components except for those of non-zero order which have values not less than a threshold value which is a function of the value of the control signal of step (c).

90. The method of claim 89 in which in the filtering step (d) the orthogonal signal components of the filtered output signal are provided in increasing order until a predetermined successive number of said components provide values which are less than a threshold value related to the value of the control signal of the analzying step (c), after which the filtered output signal does not include any higher order of components, whereby the filtering step (d) selectively delivers orthogonal signal components of lower order more closely associated with pulse signals in the input signal of step (a) while discriminating against high order components associated with noise signals.

91. The method of claim 89 in which the analyzing step (c) determines the value of its control signal by comparing the total of values of selected non-zero orders of the orthogonal signal components of the transformed signal of step (b) to the total of the values of all non-zero orders of said orthogonal signal components of the transformed signal of step (b).

92. The method of claim 89 in which the analyzing step (c) determines the value of its control signal by comparing the total of the values of a predetermined number of orthogonal signal components of non-zero low order of the transformed signal of step (b) to the total of the values of all non-zero orders of said orthogonal signal components of the transformed signal of step (b).

93. The method of claim 89 in which the analzying step (c) determines the value of its control signal by obtaining the value of the ratio of the total of the values of selected non-zero orders of the orthogonal signal components of the transformed signal of step (b) to the total of the values of all non-zero orders of said orthogonal signal components of the transformed signal of step (b) and compares the value of said ratio to a predetermined value for determining the length of a pulse signal present in the input signal of step (a).

94. The method of claim 93 in which the analyzing step (c) obtains a plurality of values of said ratio for a respective plurality of groups of selected non-zero orders of said orthogonal signal components of the transformed signal of step (b), and compares the plurality of values of said ratio respectively to a plurality of predetermined values for determining the length of a pulse signal present in the input signal of step (a).

95. The method of claim 94 in which the plurality of groups of selected non-zero orders of said orthogonal signals components of the transformed signal of step (b) obtained in analzying step (c) include a group of selected ones of said orthogonal signal components of low order and groups of selected ones of said orthogonal signal components which include successively increasing orders for providing said respective plurality of values for said ratio for comparison with said plurality of predetermined values for determining the length of a pulse signal present in the input signal of step (a).

96. The method of claim 95 in which the values of said ratio obtained in said analyzing step (c) are respectively compared with their said plurality of respective predetermined values in sequence with the orders of said orthogonal signal components of said plurality of groups of selected orders increasing to represent decreasing pulse length, and the control signal provided by said analzying group (c) related to the length of a pulse signal present in the input signal of step (a) is determined by the first sequential occurrence of a value of one of said plurality of values of said ratio which is not less than the value of its respective predetermined value to which it is compared.

97. The method of claim 96 in which the control signal delivered by the analyzing step (c) indicates that a pulse signal has not been detected in the input signal of step (a) when each of the plurality of values of said ratio is less than its respective predetermined value to which it is compared.

98. The method of claim 96 in which the control signal delivered by the analyzing step (c) has a respective value for each pulse length which is determined, with the value of the control decreasing with the decrease in the pulse length determined by the analyzing step (c).

99. The method of claim 96 in which the control signal delivered by the analzying step (c) has a value which is a direct function of the total of the values of the non-zero orders of said orthogonal signal components of the transformed signal of step (b).

100. The method of claim 99 in which the control signal delivered by the analyzing step (c) has a respective value for each pulse length which it determines, with the value of the control signal decreasing with the decrease in the pulse length determined by the analzying step (c).

101. The method of claim 95 in which the values of said ratio obtained in said analyzing step (c) are respectively compared with their said plurality of respective predetermined values, with the orders of the orthogonal signal components of said plurality of groups of said selected orders increasing to represent decreasing pulse length, and the control signal provided by the analyzing step (c) related to the length of a pulse signal present in the input signal of step (a) is determined by the occurence of a value of said plurality of values of said ratio which is not less than the value of its respective predetermined value to which it is compared.

102. The method of claim 95 in which the values of said plurality of predetermined values with which the values of said ratio are compared in the analyzing step (c) decrease in sequence to correspond with the representation of decreasing pulse length by said plurality of groups of selected orders.

103. A signal processing method including the steps of
a. receiving an input signal in the time domain including pulse and noise signals with the pulse signals occurring at unknown times and having unknown durations,
b. transforming the input signals of step (a) by an orthogonal transformation into the orthogonal domain,
c. analyzing the input signal for determining the presence of a pulse signal and its duration and providing a control signal responsive thereto,
d. filtering the transformed input signal in the orthogonal domain with filtering means having a controllable transfer characteristic responsive to said control signal and delivering a filtered output signal which provides pulse signals of the input signal while minimizing the noise signals, and
e. transforming the filtered output signal of step (d) by an inverse orthogonal transformation into the time domain,
the control signal delivered by the analzying step (c) having a value related to the length of the pulse signal present in the input signal of step (a) and determined by the value of the transformed signal of the transforming step (b), the filtering step (d) delivering the transformed signals of the transforming step (b) except for those which have a value less than a corresponding value of the control signal of the analyzing step (c).

104. The method of claim 103 in which said transforming step (b) provides a plurality of orthogonal signal components of various orders each having a respective value, and the filtering step (d) provides a filtered output signal of the orthogonal signal components except for those of non-zero order which have values less than the corresponding value of the control signal of the analyzing step (c).

105. The method of claim 104 in which the orthogonal signal components of the filtered output signal are provided in increasing order until a predetermined successive number of said components provide values which are less than a threshold value related to the value of the control signal of the analzying step (c), after which the filtered output signal does not include any high order of components, whereby the filtering step (d) selectively delivers orthogonal signal components of lower order more closely associated with pulse signals, in the input signal of step (a) while discriminating against high order components associated with noise signals.

106. The method of claim 105 in which the filtering step (d) includes averaging the values of a predetermined successive number of said non-zero orthogonal signal components of the transformed signal of transforming step (b) and providing an averaged value with the occurrence of each successive signal component, the filtering step (d) delivering the orthogonal signal components of said transformed signal or step (b) in increasing order until a predetermined successive number of said averaged values are less than said threshold value, after which the filtered output signal does not include any higher order of components, said threshold value being a direct function of the total of the values of all non-zero orders of said orthogonal signal components of the transformed signal of the transforming step (b).

* * * * *